(12) United States Patent
Xu et al.

(10) Patent No.: US 7,372,348 B2
(45) Date of Patent: May 13, 2008

(54) STRESSED MATERIAL AND SHAPE MEMORY MATERIAL MEMS DEVICES AND METHODS FOR MANUFACTURING

(75) Inventors: Baomin Xu, Cupertino, CA (US); David Kirtland Fork, Los Altos, CA (US); Michael Yu Tak Young, Cupertino, CA (US); Eugene Michael Chow, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 10/923,277

(22) Filed: Aug. 20, 2004

(65) Prior Publication Data
US 2006/0038643 A1 Feb. 23, 2006

(51) Int. Cl.
*H01H 51/22* (2006.01)
(52) U.S. Cl. .......................... 335/78; 200/181
(58) Field of Classification Search ............ 335/78; 200/181
See application file for complete search history.

(56) References Cited

U.S. PATENT DOCUMENTS

| | | | |
|---|---|---|---|
| 5,588,295 A | 12/1996 | Brotz et al. | |
| 5,613,861 A | 3/1997 | Smith et al. | |
| 5,619,177 A * | 4/1997 | Johnson et al. | 337/140 |
| 5,825,275 A * | 10/1998 | Wuttig et al. | 337/139 |
| 5,914,218 A | 6/1999 | Smith et al. | |
| 5,921,083 A | 7/1999 | Brotz et al. | |
| 6,236,300 B1 * | 5/2001 | Minners | 337/139 |
| 6,264,477 B1 | 7/2001 | Smith et al. | |
| 6,272,857 B1 | 8/2001 | Varma | |
| 6,343,849 B1 * | 2/2002 | Yun et al. | 347/20 |
| 6,392,524 B1 | 5/2002 | Biegelsen et al. | |
| 6,481,821 B1 * | 11/2002 | Yun et al. | 347/20 |
| 6,499,831 B2 | 12/2002 | Schmidlin | |
| 6,557,977 B1 * | 5/2003 | Silverbrook | 347/54 |
| 6,689,486 B2 | 2/2004 | Ho et al. | |
| 6,734,425 B2 | 5/2004 | Hantschel et al. | |
| 7,005,195 B2 * | 2/2006 | Cheng et al. | 428/615 |
| 7,104,056 B2 * | 9/2006 | Taya et al. | 60/527 |

(Continued)

FOREIGN PATENT DOCUMENTS

EP 1 243 793 9/2002

(Continued)

OTHER PUBLICATIONS

Ishida et al., "Sputter-Deposited Shape-Memory Alloy Thin Films: Properties and Applications," MRS Bulletin, pp. 111-114 (2002).

(Continued)

*Primary Examiner*—Elvin Enad
(74) *Attorney, Agent, or Firm*—Fay Sharpe LLP

(57) ABSTRACT

Disclosed is a MEMS device which comprises at least one shape memory material such as a shape memory alloy (SMA) layer and at least one stressed material layer. Examples of such MEMS devices include an actuator, a micropump, a microvalve, or a non-destructive fuse-type connection probe. The device exhibits a variety of improved properties, for example, large deformation ability and high energy density. Also provided is a method of easily fabricating the MEMS device in the form of a cantilever-type or diaphragm-type structure.

22 Claims, 17 Drawing Sheets

U.S. PATENT DOCUMENTS

2002/0113499 A1* 8/2002 von Behrens et al. ........ 310/12
2004/0252164 A1* 12/2004 Jung ........................... 347/54

FOREIGN PATENT DOCUMENTS

JP          60 195386       10/1985
WO          WO 01/31172      5/2001

OTHER PUBLICATIONS

Smith et al., "A New Flip-Chip Technology for High-Density Packaging," *Proc 46th Electronic Components and Technology Conf.* (Orlando, Florida, May 1996), pp. 1-5.

Fork et al., "Stress Engineered Metal Interconnects," 8th Annual Known Good Die Conference, Napa, California, Sep. 10, 2001, 6 pages.

Xu et al., "Characteristics and Fabrication of NiTi/Si Diaphragm Micropump," Sensors and Actuators A, vol. 93, pp. 87-92 (2001).

Wayman, "Shape Memory Alloys," MRS Bulletin, vol. 18, No. 4, pp. 49-56 (1993).

Kahn et al., "The TiNi Shape-Memory Alloy and its Applications of MEMS," J. Micromech. Microeng., vol. 8, pp. 213-221 (1998).

Makino et al., "Fabrication of TiNi Shape Memory Micropump," Sensors and Actuators A, vol. 88, pp. 256-262 (2001).

Gill et al., "Manufacturing Issues of Thin Film NiTi Microwrapper," Sensors and Actuators A, vol. 93, pp. 148-156 (2001).

Fork et al., "Nano-spring Arrays for High Density Interconnect," Proceedings of SPIE, vol. 4176, pp. 226-235 (2000).

Kuribayashi et al., "Micron Sized Arm Using Reversible TiNi Alloy Thin Film Actuators," Mat. Res. Soc. Symp. Proc., vol. 276, pp. 167-176 (1992).

Wolf, et al., TiNi (Shape Memory) Films on Silicon for MEMS Application, Journal of Microelectromechanical Systems, vol. 4, No. 4, Dec. 1995, p. 206-212.

* cited by examiner

STRESSED MATERIAL AND SHAPE MEMORY MATERIAL MEMS DEVICES AND METHODS FOR MANUFACTURING

BACKGROUND

The present exemplary embodiment is generally related to MEMS devices and methods of manufacturing such devices. More particularly, the exemplary embodiment is related to a MEMS device comprising at least one shape memory material, such as a shape memory alloy layer and at least one stressed material layer. The device can be utilized as, for example, an actuator, a microswitch, a micropump, a microvalve, and a non-destructive fuse-type connection probe.

Micro Electronic Mechanical Systems (MEMS) are microscopic devices and machines fabricated by integrating mechanical or hydraulic functions with electrical functions such as provided by computing/logic circuitry. MEMS technology has been widely utilized in a variety of industries. For example, a MEMS device can function as a sensing device, which combines a sensor and logic circuitry to perform monitoring functions such as pressure and acceleration measurement for deployment control of airbags in cars. A MEMS device can also function as a micromirror or waveguide to guide wavelengths in optical switches and tunable lasers. Typically, MEMS devices are processed with the same materials and methods used to make integrated circuits (IC's). Generally in producing a MEMS device, a tiny mechanical component such as a sensor, a valve, a gear, a mirror, and/or an actuator is incorporated in an electronic microchip such as a semiconductor chip.

An actuator can be in the form of a MEMS device that, in responding to a signal received from a control system, can change and/or maintain the position of an element such as an end-effecter in performing a task. Shape memory alloys (SMA) have great potential as actuators due to their very high displacement and energy density. However, for most SMAs, the shape memory effect is a "one-time-only" actuation (one-way shape memory effect). That is, once a SMA is recovered to its original, un-deformed state by heating to above the martensite-austenite phase transition temperature, it will retain the un-deformed state and can not be automatically returned to its previous deformed state upon cooling. As illustrated in FIG. 1, first, under a low temperature ($T_1$) environment, the SMA material exists in its martensite phase and is therefore un-deformed. At this low temperature, if a mechanical stress is applied on the SMA, it will be deformed. As the martensite phase has a low Young's modulus and a low yield strength, usually a small stress can induce a large deformation and cause plastic deformation in the material. Next, the material can be heated to a higher temperature ($T_2$) and shifted to the high temperature austenite phase. As the austenite phase has a much higher Young's modulus and yield strength, at the higher temperature ($T_2$) the material will return to its un-deformed state. For one-way shape memory effect, after cooling and returning to its martensite phase, the material will remain in the un-deformed state, a so-called one-time-only actuation.

Two-way shape memory effect is much more desirable in MEMS application since the actuator can be used repeatedly. The effect is illustrated in FIG. 2. The material will "remember" the low temperature ($T_1$) deformed state, and upon sufficient cooling of the material, it will return to its original low temperature deformed state. In order to obtain the two-way shape memory effect, a material needs special treatment and has considerably smaller recovery strain than the material with only one-way shape memory effect, thus most MEMS devices still use one-way shape memory materials.

Most shape memory devices with one-way shape memory materials need to have a mechanical bias acting on the SMA to retain the device in the deformed state at the low temperature martensite phase. FIGS. 3A and 3B depict a known microvalve 10 having such a configuration. The microvalve includes an actuator 20 consisting of a TiNi thin film 22 and a silicon spring 24 bonded to the film 22 as the mechanical bias. In low temperature or cold state (FIG. 3A) the alloy film 22 is deformed by the silicon spring 24 and the valve 10 is in a closed position. When the alloy film is heated (FIG. 3B) such as by applying a voltage across it, the film 22 will recover to the un-deformed state and the valve 10 will be in an open position. After removing the voltage the alloy film will cool and will return to its deformed state, and the valve will be in the closed position again (FIG. 3A).

FIG. 4 illustrates a known micropump 50 having a similar configuration. In FIG. 4, the micropump 50 includes a glass pressurization or evacuation cap 52 that is bonded on top of a shape memory alloy thin film diaphragm 54 so that the SMA thin film 54 is kept in a deformed state at low temperature. The micropump 50 also includes one or more check valves 56. At its low temperature state (either (I) or (II) in FIG. 4) the diaphragm 54 is in a deformed or deflected state. Upon heating, the diaphragm 54 is urged to its un-deformed state (either (III) or (IV)), thereby drawing liquid or fluid into the micropump 50 (designated as arrow A in state (III)) or inducing flow out of the micropump 50 (designated as arrow B in state (IV)). Upon cooling, the diaphragm 54 returns to its deformed state (either (I) or (II)) thereby drawing a liquid or fluid into the micropump (shown as arrow A in state (II)) or inducing flow out of the micropump (designated as arrow B in state (I)).

With regard to FIGS. 3A, 3B, and 4, it is instructive to note that while in a heated state, the SMA films are likely not absolutely flat, and may have some, but much less deformation, as a result of the forces still acting on the SMA films. As can be appreciated from FIGS. 3A, 3B, and 4, complicated structures must be provided to provide the mechanical stress biases, and their fabrication therefore requires numerous processing and assembly steps. Additionally, the size of the resulting MEMS devices is also unsatisfactorily large.

Many other mechanisms have also been explored to add a bias force to the SMA films to induce deformation, especially for SMA/substrate bimorph structures. For example, a microwrapper device was produced by using a NiTi SMA thin film/polyimide bi-layer structure as described by Gill et al. in "Manufacturing Issues of Thin Film NiTi Microwrapper," Sensors and Actuators A 93 (2001), 148-156, herein incorporated by reference. Due to the large difference between the thermal expansion characteristic of NiTi and polyimide, large residual stress is developed when the device is cooled from the polyimide deposition temperature to room temperature. At room temperature, the NiTi is in martensite phase and has a low Young's Modulus and low yield strength. As a result, the device curls upward. When heating the device to induce the martensite-austenite phase transition, the device becomes flat, since when in the austenite phase the NiTi film has a much higher Young's modulus and yield strength. Similarly, many NiTi/Si bimorph devices are known which utilize the thermal mismatch between the NiTi film and a silicon substrate to generate residual stress, or different residual stresses when the NiTi is in martensite phase and austenite phase, which in turn result in displacement of the device.

However, other strategies achieve two-way shape memory effects by using a compositionally graded NiTi bimorphic structure, without an external bias, such as in U.S. Pat. No. 6,689,486 to Ho et al., herein incorporated by reference.

Metal films with internal stresses have been used to make contact probes for packaging and out-of-plane microcoils for RF electronics. The ability of the metal film to be bent in a loop indicates that very large elastic energy can be stored in the film, which in turn suggests its use in high energy or large displacement actuators. Nonetheless, the application of such films in a MEMS actuator is so far limited and unsatisfactory, at least partially, because release of the metal film is also a "one-time-only" actuation. That is, as previously explained with regard to SMA's, after being released and bent, it is very difficult to recover the metal film to its original flat state. While it has been suggested to use electrostatic force to pull the film back to the original state, there are still many problems associated with that approach such as the very high applied voltage that would be needed.

Accordingly, the present exemplary embodiment overcomes the noted problems, and provides an improved MEMS device by combining at least one shape memory alloy (SMA) layer and at least one stressed material layer, and incorporating the layered assembly in a MEMS device.

BRIEF DESCRIPTION

In one aspect of the exemplary embodiment, a MEMS device is provided comprising at least one shape memory material, such as a shape memory alloy (SMA) layer and at least one stressed material layer.

In another aspect of the exemplary embodiment, the noted MEMS device is an actuator, a switch, a micropump, a microvalve, or a non-destructive fuse-type connection probe.

In a further aspect of the exemplary embodiment, methods are provided for preparing a MEMS device such as a non-destructive fuse-type connection probe and an actuator having a cantilever structure.

In yet another aspect of the exemplary embodiment, methods are provided for preparing a MEMS device such as an actuator having a diaphragm structure.

Specifically, in one aspect of the exemplary embodiment, a device is provided which comprises a layer of a shape memory material, and a layer of a stressed material adjacent to the layer of the shape memory material. The layer of the stressed material possesses an inherent stress imparted to that layer during its formation. As a result of the inherent stress in the layer of the stressed material, the device is biased to an initial deformation state.

In another aspect, the exemplary embodiment provides a reversibly and selectively deformable MEMS device. The device comprises a released assembly including (i) at least one layer of a stressed material having an inherent mechanical stress, and (ii) at least one other layer proximate to the layer of stressed material. The other layer serves to apply a mechanical load upon the layer of stressed material. The stress in the stressed material layer is defined at a pre-release state of the assembly. The inherent mechanical stress in the layer of stressed material causes the assembly to assume a post-release state. Upon selectively changing the physical properties of the other layer, the assembly is reversibly and selectively deformed to another state different than the post-release state.

In yet another aspect of the exemplary embodiment, a selectively deformable MEMS device is provided comprising at least one shape memory alloy layer. The shape memory alloy exhibits an inherent stress. The stress gradient in the shape memory alloy layer causes the device to assume an initial deformation state. Changing the mechanical property of the stress gradient of the shape memory alloy layer by changing the temperature causes the device to assume another deformation state which is different than the initial deformation state.

In another aspect of the exemplary embodiment, a method of making a device including (i) at least one shape memory alloy (SMA) layer and (ii) at least one stressed material layer is provided. The device has a cantilevered structure. The method comprises a step of providing a substrate. The method also comprises a step of depositing a sacrificial layer on the substrate. The method also comprises a step of depositing and annealing a SMA film. The method further includes depositing a stressed material film, in which the deposition parameters of the stressed material are controlled to induce stress or produce a stress gradient in the stressed material film. The method also comprises a step of removing the sacrificial layer or a portion thereof, thereby releasing the SMA film and the stressed material film from the substrate and producing a cantilevered layered device.

In a further aspect of the exemplary embodiment, a method of making a device including (i) at least one shape memory alloy (SMA) layer and (ii) at least one stressed material layer is provided. The device has a diaphragm structure. The method comprises a step of providing a substrate. The method also comprises a step of depositing a SMA film. The method further comprises a step of depositing a stressed material film, and controlling the deposition parameters to induce stress or stress gradient in the stressed material film. The method also comprises a step of patterning the substrate material to form a cavity.

In another aspect, the exemplary embodiment provides a method of producing a device including (i) at least one shape memory alloy (SMA) layer and (ii) at least one stressed material layer. The method comprises a step of providing a first substrate. The method comprises another step of depositing a sacrificial layer on the substrate. The method also comprises a step of depositing and annealing a SMA film. The method further comprises a step of depositing a stressed material film, wherein the deposition parameters are controlled to induce stress or produce a stress gradient in the stressed material film. The method also comprises a step of affixing a target substrate to the stressed material film. And, the method comprises a step of removing the sacrificial layer and the first substrate.

DETAILED DESCRIPTION

Figure 1:
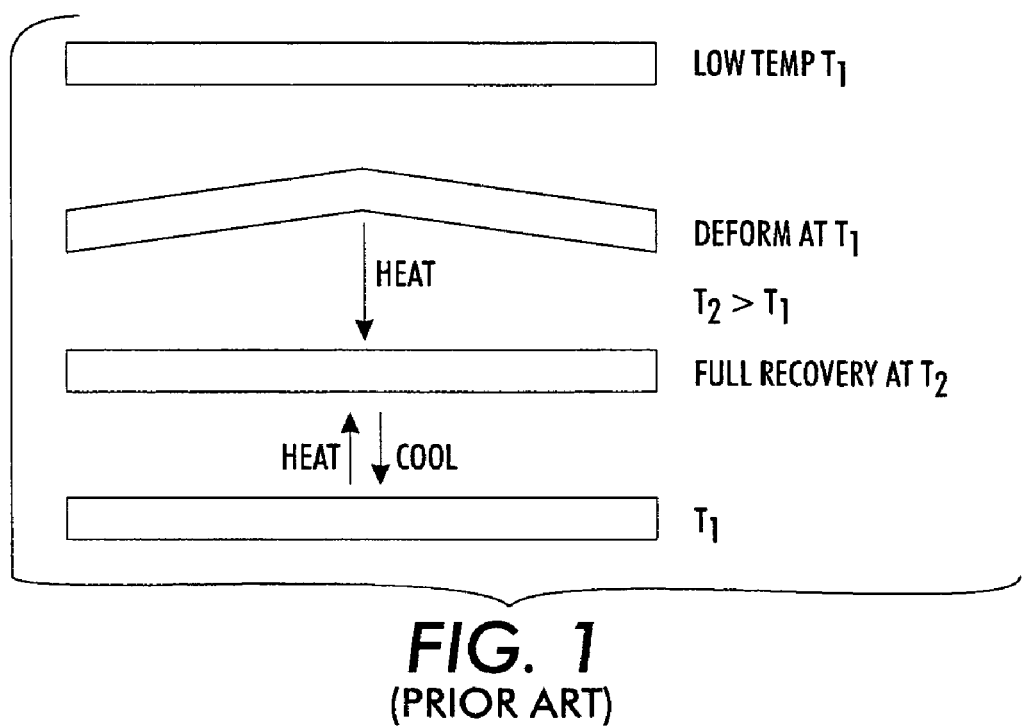
FIG. 1 is a schematic illustrating one-way shape memory effect.
Figure 2:
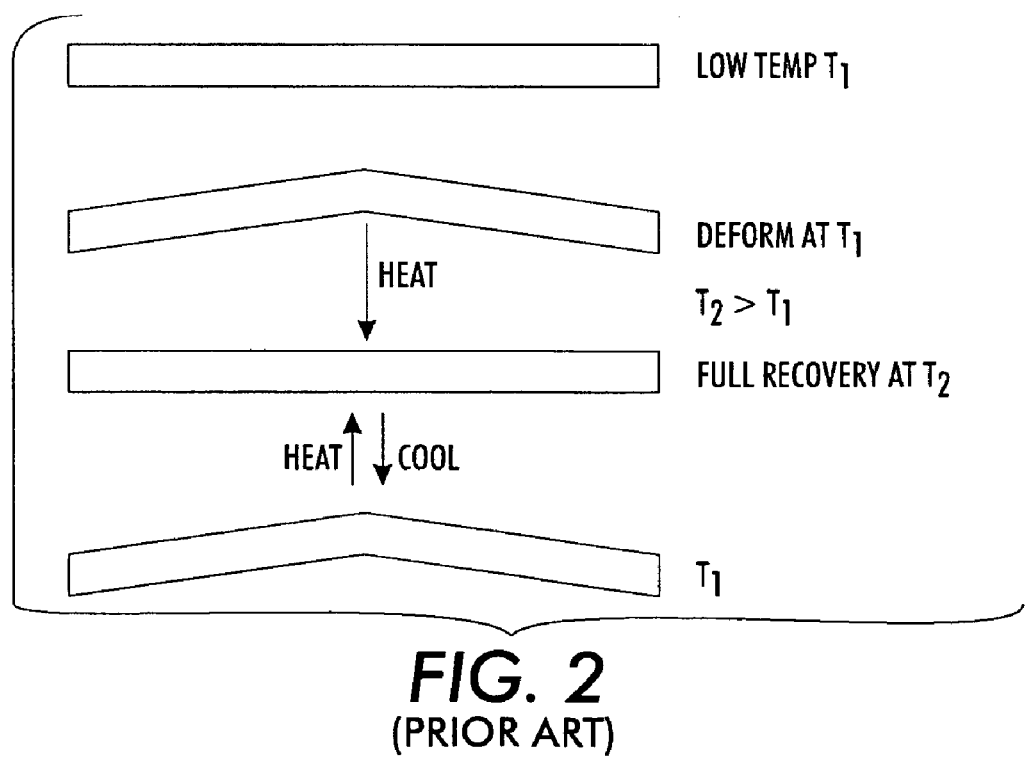
FIG. 2 is a schematic illustrating two-way shape memory effect.

The exemplary embodiment described herein relates to a multiple-layer device comprising one or more shape memory material layers such as SMA layers and one or more stressed material layers such as stressed metal layers. In certain versions, the device utilizes a single layer configuration. The term "stressed material" as used herein refers to a material that includes an inherent or intrinsic mechanical stress or stress gradient. The inherent mechanical stress or stress gradient of the referenced stressed material is with respect to that material, or layer of that material, at its pre-release state during or after its manufacture. As described in greater detail herein, during formation of the devices and assemblies of the exemplary embodiment, one or more stresses are induced or otherwise created within the stressed material used in the device. At some phase in the manufacture of the device, the stressed material or layer of that material is physically released from an adjacent substrate or member. The release of that stressed material will alter the stresses and stress profile within that material. Thus, the stresses referred to in the definition of the term "stressed material" are those stresses existing prior to release of the material.

A significant advantage of the exemplary embodiment is that unlike prior art layered assemblies using SMA's, a thermal mismatch between the stressed material layer and the shape memory layer(s) is not required. This thermal mismatch, relied upon by prior art assemblies, utilized the difference between coefficients of thermal expansion between the layer of shape memory material and another material which was typically a substrate.

The stresses in the stressed material layer(s) can be either compressive or tensile. The stress can arise or be induced in the material in a variety of fashions. However, a typical strategy in producing a layer or film of a stressed material is to induce such stress during formation, such as by vapor deposition, of the material. If the stressed material is a stressed metal, either a tensile stress or a compressive stress, or a stress gradient can be imparted to a layer of the metal by appropriate selection of the deposition conditions. In one aspect of the exemplary embodiment, the stressed metal layer is formed by, in a controlled manner, depositing the material with compressive or tensile stress or a stress gradient in the layer. For example, when depositing a MoCr 80/20 thin film, the intrinsic stress in the thin film changes as a function of Argon pressure, and the compressive-tensile stress can be controllably changed by more than $-1.0$ to $+1.0$ GPa. The stressed material layer is generally deposited or otherwise disposed on the SMA layer. The SMA layer can be disposed on a MEMS substrate. The exemplary embodiment includes reversal of this order of layers, and also includes variations in the order of layers. The internal stress or stress gradient of the stressed metal material, when the SMA material is in its martensite phase, effectively causes the multiple-layer MEMS device to bend or otherwise be displaced away or toward the MEMS substrate. Furthermore, as described in greater detail herein, one or more other materials besides metals may be used for the stressed material layer.

The exemplary embodiment can employ any suitable SMA material that undergoes a reversible crystalline phase transition, such as for example from martensite to austenite, when heated through its phase change transition temperature. Obtaining an intrinsic reversible effect for such a material can be accomplished by certain manufacturing methods for example by depositing the material by a method known as "Melt Spinning", or by the use of a thermo-mechanical treatment commonly referred to as the "education method" which induces a "memorized" preferred martensite shape to the SMA material. When the material is below its transition temperature, i.e., in its martensite phase, the material can be plastically deformed in response to an applied stress. During the phase transition, the material forcefully deforms toward the memory shape to which it is "trained" by, e.g., annealing.

Merely by way of non-limiting examples, SMA materials which can be used in the exemplary embodiment include NiAl, TiNi, TiNiHf, TiNiCu, TiNiNb, TiNiPd, TiNiCo, TiPdNi, AgCd, AuCd, CuZn, CuZnGa, CuZnSi, CuZnSn, CuZnAl, CuAlNi, CuSn, CuAuZn, InTl, InCd, MnCd, and the like, and mixtures thereof. Other SMA materials for use in the exemplary embodiment include those materials described in "Engineering Aspects of Shape Memory Alloys", T. W. Duerig et al., Ed. Butterworth-Heinemann, 1990; and "Shape memory materials", Edited by K. Otsuka and C. M. Wayman, Cambridge University Press, 1998, the entire contents of both of which are hereby incorporated by reference.

Suitable SMA materials for use in the exemplary embodiment, have an actuation energy density of from about 10 to about 200 $MJ/m^3$, and more specifically from about 80 to about 120 $MJ/m^3$; and a recoverable strain of from about 0.1% to about 20%, and more specifically from about 5% to about 15%. However, it will be appreciated that the exemplary embodiment includes the use of SMA materials having different values for these characteristics.

In another aspect of the exemplary embodiment, the SMA material is TiNi alloy, which is an alloy of nearly equal or different atomic weights of titanium and nickel. TiNi alloy not only has very useful thermo-mechanical properties such as a large energy density (1 J/g) and large displacement (10% strain), but it is also compatible with many biological agents. Sputtering is one way to fabricate a thin film of NiTi.

A wide array of shape memory materials can be used in the exemplary embodiments described herein. For example, one or more polymer materials, one or more ceramic materials, composites of these materials, or combinations of these materials could be used.

The stressed materials suitable for use in the exemplary embodiment are any materials that provide or can be configured to provide sufficient mechanical stress bias to cause deformation of the selected SMA component in the MEMS device or system. And, as previously noted, these materials include a stress or stress gradient at the pre-release state of their manufacture. Exemplary stressed materials include, but are not limited to, metals, alloys, oxides, nitrides, semiconductors, Si, carbide, diamond, and various polymers etc. which have controllable internal stress or stress gradients. Representative stressed materials in the exemplary embodiment include, but are not limited to, metals and alloys such as Mo, "moly-chrome" alloy (MoCr), tungsten (W), titanium-tungsten alloy (TiW), chromium (Cr), nickel (Ni), and nickel-zirconium alloy (NiZr). In one aspect of the exemplary embodiment, the stressed material is a stressed metal alloy, such as MoCr.

The stressed material layers used in the exemplary embodiment structures, devices, and systems described herein are also characterized by exhibiting a relatively homogenous or uniform composition. That is, the chemical composition of the stressed material layer generally does not vary, at least not to an appreciable extend, across the thickness of a layer of the material. The stressed material layers are deposited or prepared separately, and the composition or elements of the stressed material can be totally different from that of the SMA material. This is in contrast to metal films having stresses and a compositional gradient across their thickness, such as described in U.S. Pat. No. 6,689,486 and those described by Kuribayashi et al. in "Micron Sized Arm Using Reversible TiNi Alloy Thin Film Actuators," Mat. Res. Soc. Symp. Proc., Vol. 276, p. 167-176. (1992).

Stressed metal films have been studied for use as contact probes for packaging and out-of-plane microcoils for RF electronics. For certain stressed materials, relatively large amounts of elastic or potential energy can be stored therein by bending or otherwise severely displacing the material, such as by bending the material in the form of a loop. These stressed materials are particularly useful for high energy or large displacement actuators in accordance with the exemplary embodiment described herein.

Multi-layered devices and structures of the exemplary embodiment are also characterized by having, at least at the time immediately after their manufacture, a distinct boundary or interface between the layer of stressed material and an adjacent layer, such as a layer of a SMA. That is, for those devices or structures having at least one stressed material layer and at least one SMA layer, the region immediately between those layers is characterized by a distinct change in composition (due to compositional differences between the adjacent layers) and a distinct change in physical properties (likely due to the compositional difference). Furthermore, this region may also be characterized by a distinct difference in the types, profiles or gradients, or magnitudes of stress in the corresponding adjacent layers. Although the exemplary embodiment is primarily directed to layered arrays in which the stressed material layer is immediately adjacent to the SMA layer, other arrangements are contemplated. For example, these layers may be separated by one or more other layers, and so, not be immediately adjacent to one another.

Figure 5:
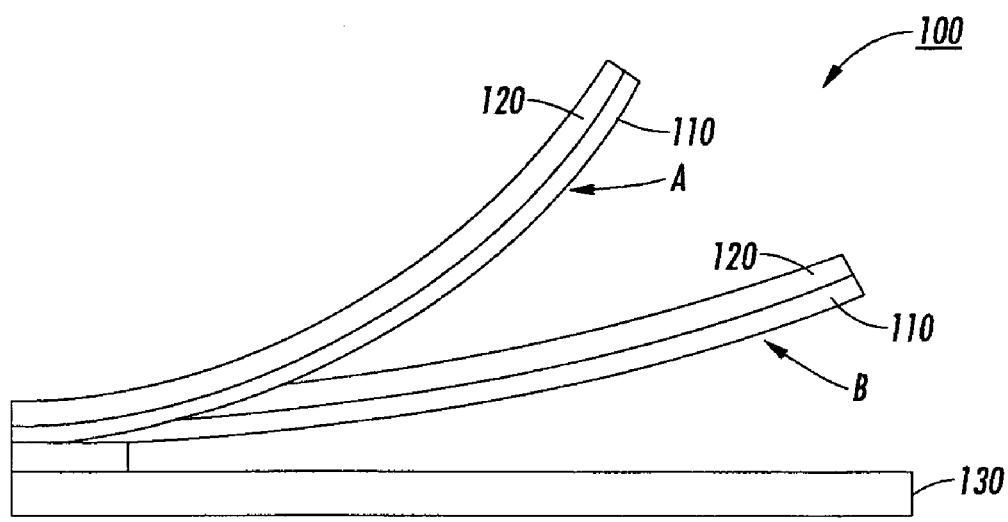
FIG. 5 shows a system in accordance with the exemplary embodiment having a cantilever structure with one layer of SMA film and one layer of a stressed metal film with deposited tensile stress or stress gradient.

The MEMS device of the exemplary embodiment can take the structural form of a cantilever. With reference to FIG. 5, a system 100 having a cantilever configuration is constructed with one layer of SMA film 110 and one layer of stressed metal film 120 having a deposited tensile stress. Alternately, the stressed metal film 120 can also have a stress gradient with a compressive stress near the bottom and a tensile stress at the top surface. The system 100 can function as an actuator. The SMA film 110 is affixed or otherwise secured to a substrate 130. It will be appreciated that the tensile stress in the metal film 120 causes the film 120, and thus the collection of layers 110 and 120, to "curl" upward. A downward curl could be achieved by forming the metal film 120 to have a compressive stress, or a stress gradient with tensile stress near the bottom and compressive stress at the top surface. Alternately, the direction of curl could be reversed by reversing the arrangement of the layers 110 and 120. For example, if the stressed metal film 120 were located under the SMA film 110, an upward curl could be obtained by depositing the stressed metal film 120 with a compressive stress. And, a downward curl could be obtained by depositing the stressed metal film (underneath the SMA film 110) to have a tensile stress. When the system 100 is in a cold state, i.e. the temperature is less than the phase change temperature of the SMA material, the cantilever structure will assume a position designated as "A" as shown in FIG. 5. Upon heating the system 100 to a temperature greater than the phase change temperature of the SMA material, the structure will be displaced to a position designated as "B" in FIG. 5. As previously explained, the displacement of the structure from position A to B, is caused by the increase in the modulus and/or yield strength of the SMA film 110 due to heating, which exceeds the mechanical bias imparted to the structure by the stressed metal film 120.

Figure 6A:
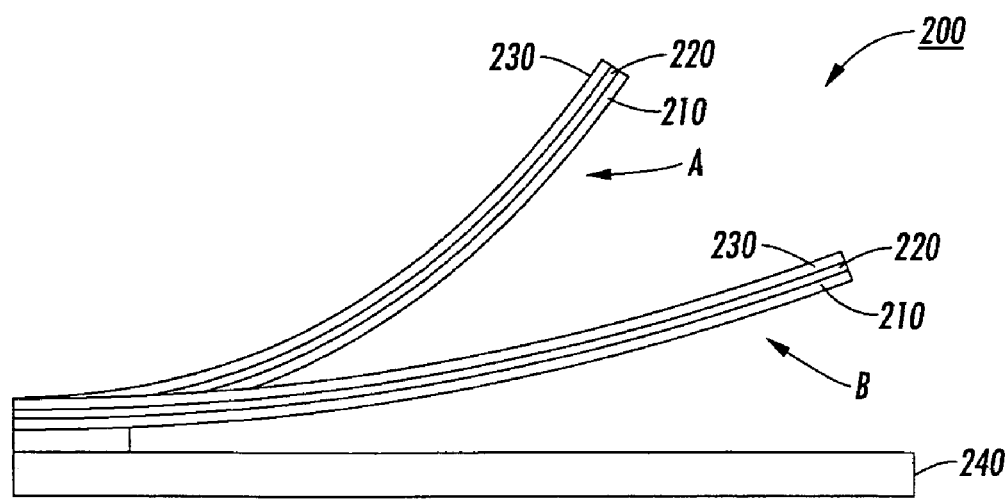
FIG. 6A shows a system in accordance with the exemplary embodiment having a cantilever structure with one layer of SMA film, one layer of a first stressed metal film with deposited compressive stress, and one layer of another stressed metal film with deposited tensile stress.

With reference to FIG. 6A, a system 200 having a "sandwich" type cantilever structure is constructed with one layer of SMA film 210, one layer of a first stressed metal film 220 with deposited compressive stress, and one layer of a second stressed metal film 230 with deposited tensile stress. The collection of films 210, 220, and 230, and specifically the SMA film 210, are affixed or otherwise secured to a substrate 240. As previously described with regard to FIG. 5, upon heating, the structure is displaced from position A shown in FIG. 6A, to position B.

In FIG. 5 and FIG. 6A, stressed metal film(s) and SMA film are combined together to form active micro devices. The stressed metal film(s) provide a mechanical bias to the SMA films. More specifically, at low temperature or cold state, preferably at room temperature, the SMA film is in its martensite phase and has a lower Young's modulus and yield strength, and hence imparts a softer load on the stressed metal film. The stress or stress gradient in the stressed metal film(s) cause the device or assembly of films to be displaced to a state with a relatively large bending deformation. For a cantilever structure, this may be exhibited by the curvature of the displaced structure being smaller or "tighter." By raising the environmental temperature, or by applying heat, such as applying an electrical current flow through the device, the SMA film will transfer to its austenite phase and the device will exhibit much less deformation due to the large Young's modulus and high yield strength of the austenite phase. Preferably, the device will ideally recover to the un-deformed and flat state. This process can be reversed when the temperature is again lowered, and the device again is in the cold state and returns to the original, large bending or deformation state. The cycle can thus be repeated for many times as desired by repeatedly increasing and decreasing the temperature, which enables the exemplary embodiment MEMS device to function as a two-way, multiple-time actuation device.

As previously illustrated in FIG. 6A, a collection of stressed material layers can be utilized instead of a single layer of a stressed material. In the case of stressed metals, it may be advantageous to use two or more layers in order to achieve a predetermined desired total stress for the layered system. By appropriately selecting particular types of stress, i.e. compressive or tensile, and their value or magnitude, a total stress can be calculated by summing the individual stresses to obtain a total stress. As an example, a desired total tensile stress can be obtained by the use of two layers of a stressed material so long as either (i) both stressed material layers each have a tensile stress which sums to the desired total, or (ii) if one has a compressive stress, then the other must have a tensile stress greater than the magnitude of the compressive stress of the other, and, the respective stresses must sum to the desired total.

Figure 6B:
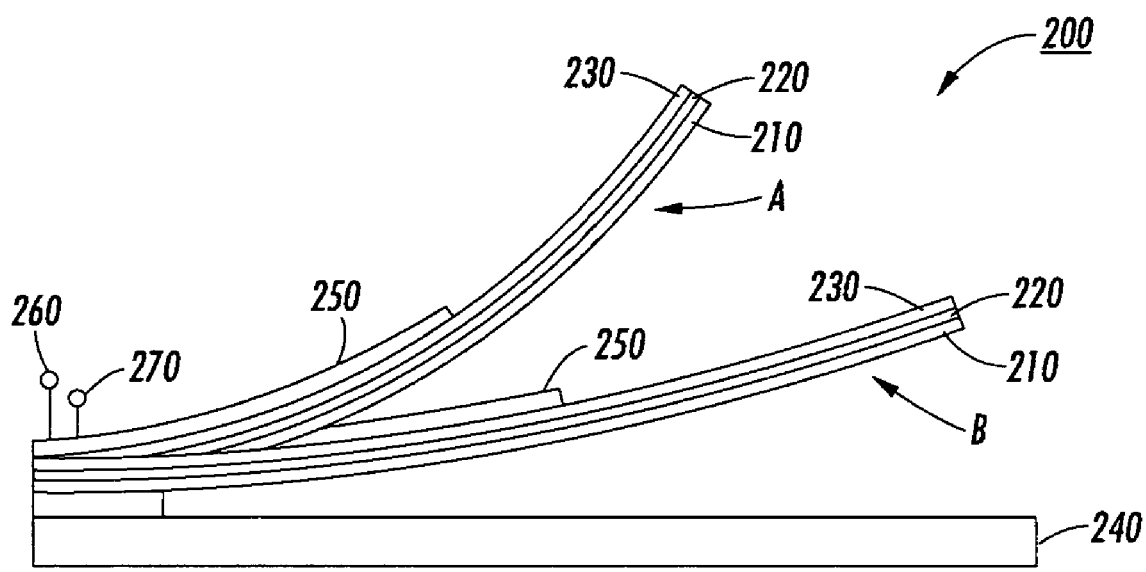
FIG. 6B shows a system in accordance with the exemplary embodiment having a cantilever structure with one layer of a SMA film, one layer of a first stressed metal film, a second layer of a stressed metal film, and a layer of a piezoelectric material.

In addition to the SMA film and stressed material film, another functional material film can be deposited or otherwise incorporated in the layered array. For example, a film can be deposited which is used to more precisely to detect the position or shape of the device. This sensor film can have the same dimensions, or in certain embodiments, be smaller than the SMA film and stressed material film. For example, as depicted in FIG. 6B, a smaller sensor film 250 is deposited on the device of FIG. 6A, and connected to an external electrical circuit through wire connections 260 and 270. The remaining numbers in FIG. 6B correspond to those in FIG. 6A. The sensor film 250 can be a piezoelectric thin film or a semiconductive piezoresistive material. When a piezoelectric thin film is used, under different curvature or device positions, the piezoelectric thin film will be under different stress conditions. Thus, the curvature or position of the device can be more accurately detected and controlled.

By appropriate selection of materials, and arrangement and formation of those materials into layers or regions in the exemplary embodiment devices, structures, and systems described herein, a wide array of cantilevered assemblies with a variety of motions can be formed. Many of the cantilevered structures previously described undergo deflection in a single plane, and for example either up or down. By incorporation of effective amounts of a stressed material and/or a SMA into select lateral regions of a layered array, deflection or displacement in two planes can be achieved. For example, a cantilever structure capable of lateral movement could also provide for yaw and tilt actions.

Figure 7:
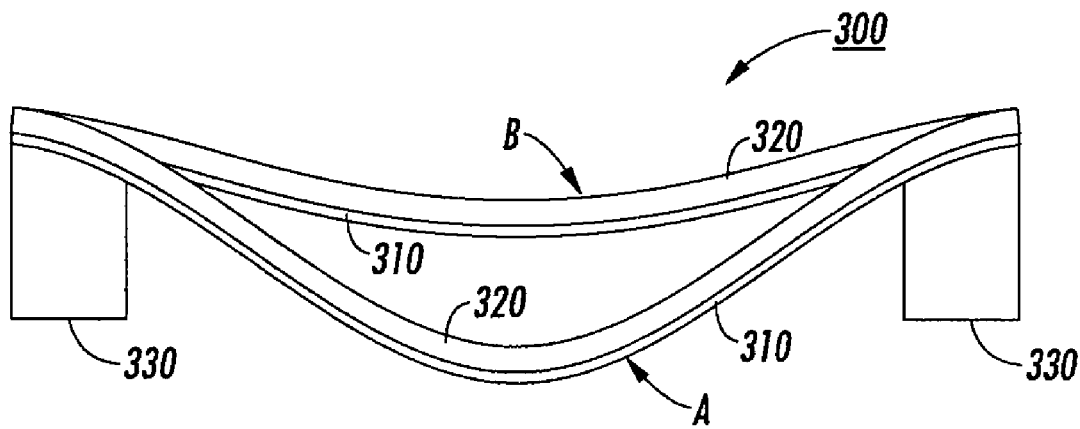
FIG. 7 shows a system in accordance with the exemplary embodiment having a diaphragm structure with one layer of SMA film, and one layer of a stressed metal film with deposited tensile stress.

The MEMS device of the exemplary embodiment can also take the structural form of a diaphragm. FIG. 7 shows a MEMS device or system 300 with a diaphragm structure, which comprises one layer of a SMA film 310, one layer of a stressed metal film 320 with deposited tensile stress, which is deposited or otherwise secured to substrates 330 that define a void or open space or region between them. In its cold state, the films are in position A. And, upon heating, the films are displaced to position B. This movement or displacement, as will be appreciated, can be utilized in a wide variety of applications such as the transfer of a fluid or liquid.

Figure 8:
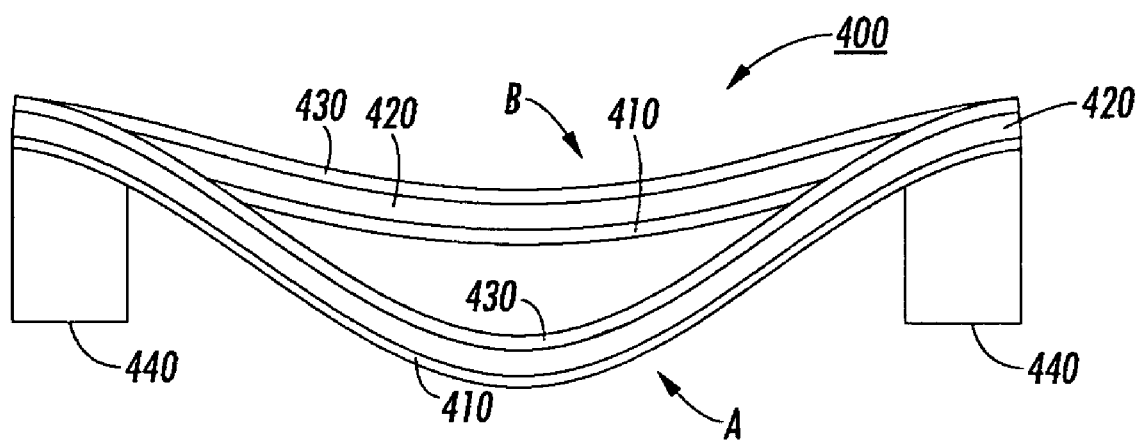
FIG. 8 shows a system in accordance with the exemplary embodiment having a diaphragm structure with one layer of SMA film, one layer of a first stressed metal film with deposited compressive stress, and one layer of another stressed metal film with deposited tensile stress.

With reference to FIG. 8, a diaphragm device or system 400 is illustrated with one layer of SMA film 410, one layer of a first stressed metal film 420 with deposited compressive stress, and one layer of a second stressed metal film 430 with deposited tensile stress. The collection of films 410, 420, and 430 are secured to spaced apart substrates 440. Upon heating the collection of films, the assembly is displaced from position A to position B.

Figure 9:
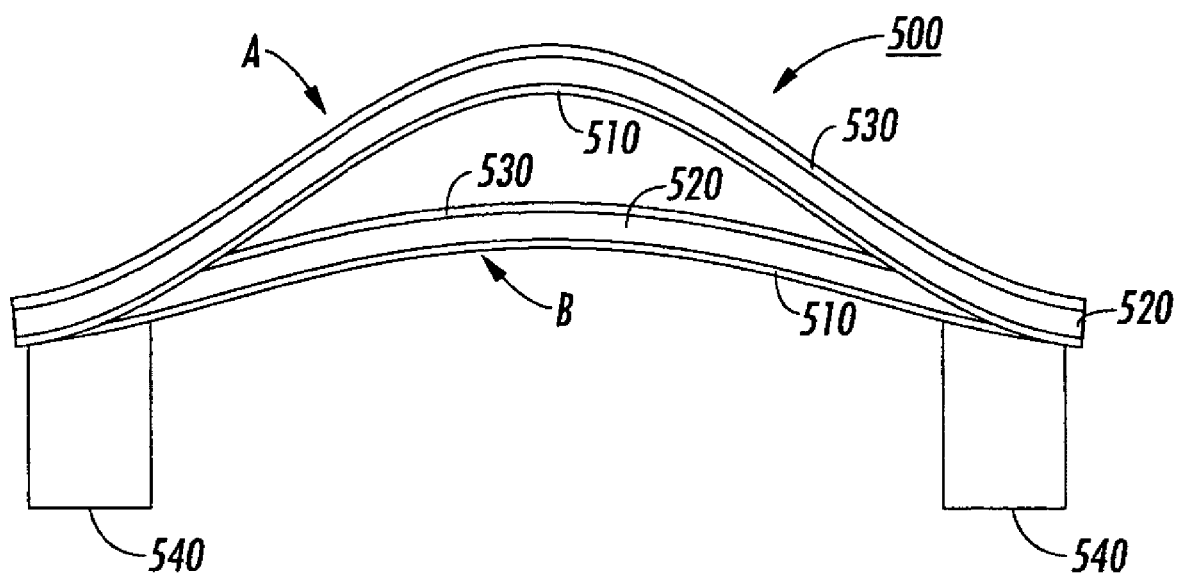
FIG. 9 shows a system in accordance with the exemplary embodiment having a diaphragm structure with one layer of SMA film, one layer of a first stressed metal film with deposited tensile stress, and one layer of another stressed metal film with deposited compressive stress.

FIG. 9 illustrates a device or system 500 having a diaphragm structure according to the exemplary embodiment with one layer of SMA film 510, one layer of a first stressed metal film 520 with deposited tensile stress, and one layer of a second stressed metal film 530 with deposited compressive stress. The collection of films 510, 520, and 530 are secured or otherwise attached to substrates 540 that are spaced apart so as to provide an open region or space generally adjacent to one side of the collection of films. As previously described, the films are displaced from position A to position B by heating the films, and specifically, by heating the SMA film 510 to a temperature sufficient to induce a phase change.

In accordance with the exemplary embodiment, temperature control is crucial in triggering the SMA martensite-austenite phase transition. The characteristic temperatures of the beginning and end of the martensite-austenite transition are respectively designated $A_s$ and $A_f$. The characteristic temperatures of the beginning and end of the austenite-martensite transition are respectively designated $M_s$ and $M_f$. For a specific SMA material, when the martensite-austenite transition is to be activated, the temperature should be higher than $A_s$, and preferably higher than $A_f$. In contrast, when the austenite-martensite transition is to be activated, the temperature should be lower than $M_s$, and preferably lower than $M_f$.

Depending upon the composition of the various layers, variations of the structure and combination of layers, and the structure of the MEMS device, the SMA phase transition temperature can be varied from about −200° C. to about 110° C. Experiments on stressed metal springs indicate that cycling the spring between room temperature and 150° C. will not substantially release the stress or stress gradient in the film. The transition temperature of most SMA films is about 60 to 75° C., or lower. Such thermal cycling should not cause stress degradation in the stressed metal film, hence the stressed metal/SMA actuators of the exemplary embodiment are reliable devices. Usually, the SMA thin films utilized in the exemplary embodiment devices are tuned to have the phase transition temperature greater than room temperature, i.e. 20° C., such as for example about 60 to about 75° C.

The temperature control of the MEMS devices in accordance with the exemplary embodiment can be achieved by, in addition to adjusting the environmental temperature of the device, Joule or resistive heating such as applying an electrical current flow through the device, at up to several hundred Hz. By applying heating to induce the martensite-austenite phase transition, the device will exhibit much less bending deformation due to the high Young's modulus and yield strength of the austenite phase. By removing the applied current flow, the device will cool and return to its original, large bending or deformation state. The electrical current can be reapplied to the device and the cycle can be repeated as many times as desired.

Figure 10A:
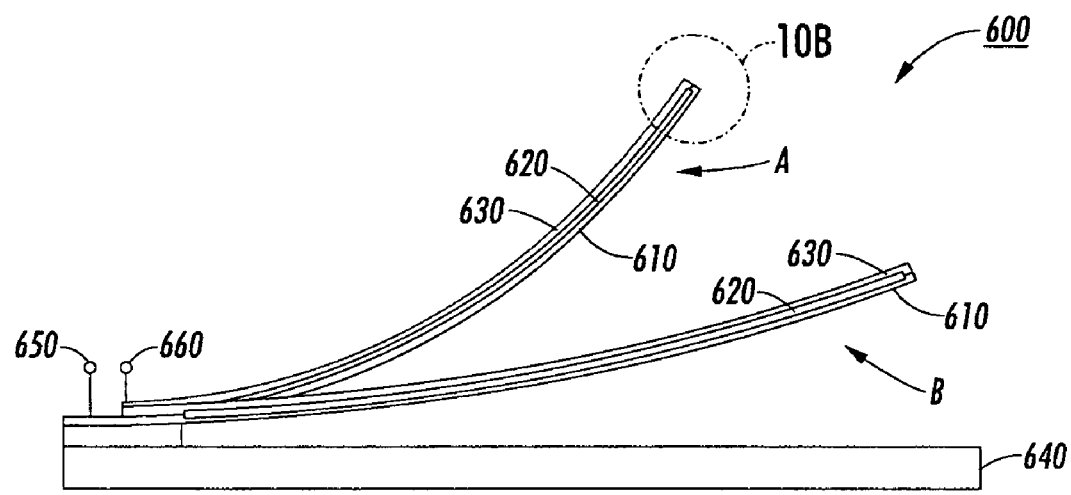
FIG. 10A shows a system in accordance with the exemplary embodiment having a cantilever structure with a very thin dielectric layer deposited between the stressed metal film and the SMA film.
Figure 10B:
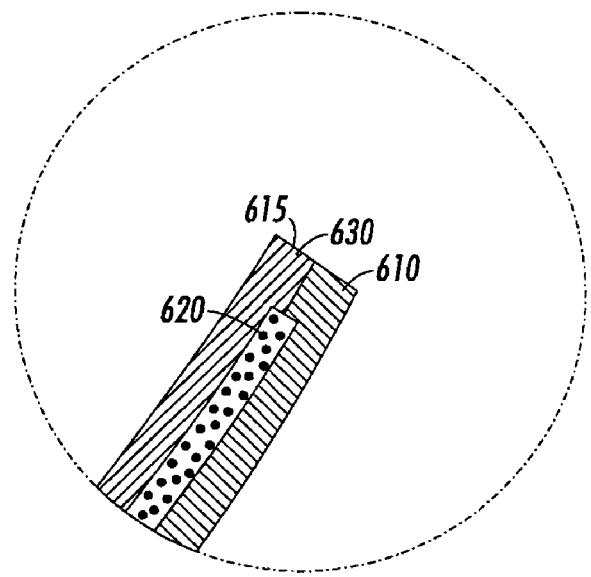
FIG. 10B is a detail of a distal free end of the structure shown in FIG. 10A.

In one aspect of the exemplary embodiment, when electrical current flow is used to provide heating to the MEMS device with a cantilever structure, careful design is required so that current flows through the films so as to effectively generate heat. Generally, a wire connection is made at the fixed or clamped end of the layers. By way of examples, FIGS. 10A, 10B, 11A and 11B depict two cantilever-type actuation devices in which electric current is used to generate heating in a layered assembly. FIGS. 10A and 10B illustrate a system 600 having a layer 610 of a SMA, and a layer of a stressed metal 630, with a cantilever structure. Disposed between the layers 610 and 630 is a very thin dielectric layer 620 such as silicon oxide. The device has a stack electrode configuration which can have electrical bias. As can be seen in FIG. 10A, one end of the layered assembly is affixed or otherwise secured to a substrate 640. Specifically, the configuration of the distal or free end 615 of the layered assembly is shown in FIG. 10B. There, it can be seen that the dielectric layer 620 does not completely extend to the distal end 615 of the assembly. Instead, the SMA layer 610 and the stressed metal layer 630 contact one another at only the end 615 and thereby provide electrical communication between the layers 610 and 630. Referring to FIG. 10A, wire connections 650 and 660 are provided for providing electrical access to the layers 610 and 630, respectively. Referring further to FIGS. 10A and 10B, it will be understood that current flow between connections 650 and 660 will occur across the entire length, or nearly so, of the layered assembly since the only point of electrical communication between the layers 610 and 630 is at their end 615 detailed in FIG. 10B.

The exemplary embodiment also includes the use of an additional heating element, in addition to the layers of stressed material and the SMA. In this aspect, the separate heating element is incorporated in the layered array and provides heat to the layer of SMA. Such separate heating elements can generate heat in a variety of fashions, for example by resistance heating. In the event a separate heating element is not used, either or both of the layers of stressed material and SMA can serve as heating elements.

Figure 11A:
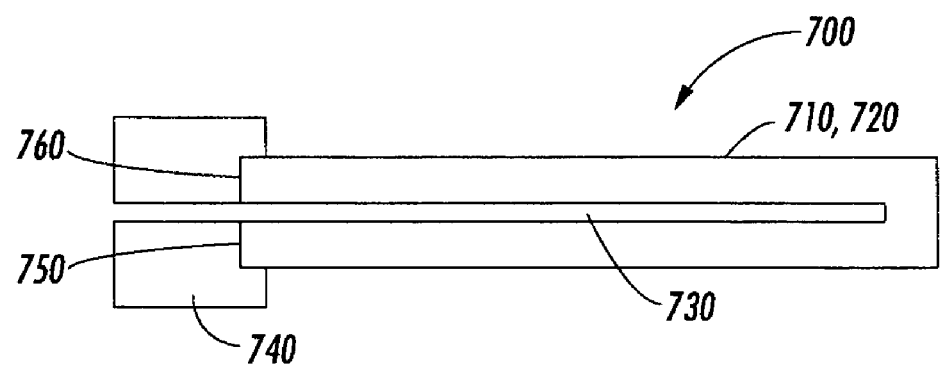
FIG. 11A shows a top schematic view of a system in accordance with the exemplary embodiment having a cantilever structure with a narrow and long opening defined across a portion of the length of the assembly.
Figure 11B:
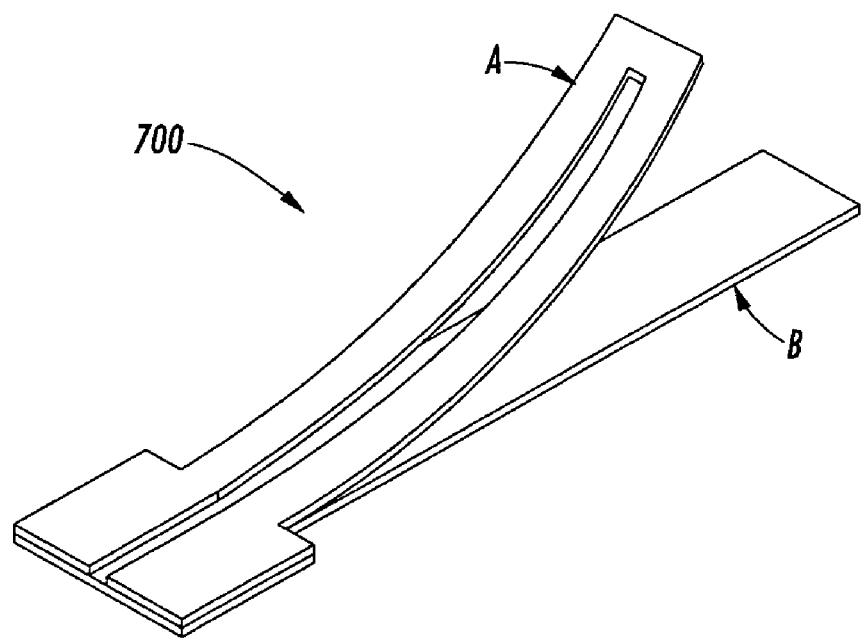
FIG. 11B illustrates the assembly of FIG. 11A in a cold state and in a heated state.

FIGS. 11A and 11B illustrate a cantilevered system 700 having an SMA layer 710 and a stressed metal layer 720 defining a narrow and long opening 730. It will be appreciated that this open region 730 could be filled with a dielectric material. FIG. 11B is a perspective view showing the device in a cold state A, and a heated state B. The device 700 has a coplanar electrode configuration which utilizes an electrical bias. Specifically, FIG. 11A illustrates layers 710 and 720 attached at one end to a substrate 740. Wire connections 750 and 760 are provided for providing electrical connection to the respective regions of the layers 710 and 720 separated by the opening 730. Thus, upon connection to an electrical power source, current flows from one of the connections 750 or 760, across the length of the assembly, and back again across the length to the other electrode. According to the exemplary embodiment, the pattern and condition of the device and/or electrode is so designed that the resistance of the device is matched to the output resistance of the current driver to obtain maximum actuation efficiency.

Figure 12:
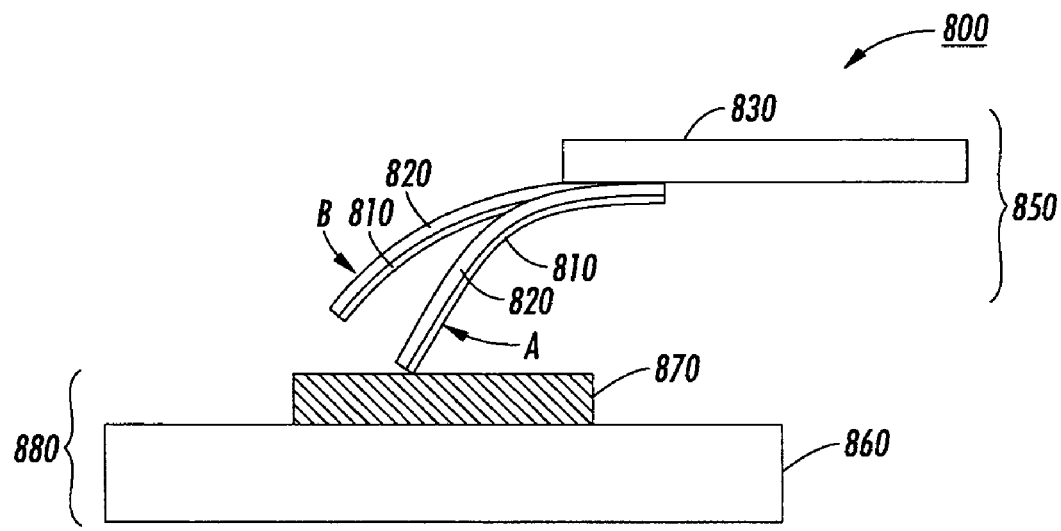
FIG. 12 is an illustration of a stressed metal/SMA probe with a non-destructive fuse function.

The exemplary embodiment also provides a multiple-layer non-destructive fuse-type connection probe, which can be used in, for example, packaging applications. The probe comprises one or more SMA layers and one or more stressed material layers such as stressed metal layers. In one aspect of the exemplary embodiment, the stressed metal layer is formed by, in a controlled manner, depositing the material with compressive or tensile stress or a stress gradient on the SMA layer. The internal stress or stress gradient of the stressed metal can, when the SMA material is in its martensite phase, effectively cause the multiple-layer probe to bend away or toward a connection point. An example of the stressed metal/SMA probe with a non-destructive fuse function is illustrated in FIG. 12. With reference to FIG. 12, a system 800 is illustrated comprising a probe 850 that is in selectable contact or communication with a device 880. The probe 850 comprises a SMA layer 810 and a stressed metal layer 820, which are secured or otherwise attached to a substrate 830. The device 880 includes a contact pad or surface 870 defined or disposed on a substrate 860. The SMA film phase transition temperature can be so tuned to such an extent that, if the environmental temperature is greater than the safety temperature, the SMA film will transition to the austenite phase so that the probe will be disconnected from the device and move to position B. This is because the stressed metal is deformed relatively much less when the SMA transfers to the austenite phase. When the environmental temperature is lower, the probe will be connected to the device again, as in position A, as the SMA film will transfer back to the martensite phase. In another related aspect of this embodiment, the SMA film can be heated by passing a current through it (Joule heating). For a specific probe, a well-defined quantitative relationship between the electrical current through the probe and the temperature of the probe can be established. A safety current can therefore be calculated for a safety temperature, and vise versa. When the current in the probe is larger than the safety current, the SMA film will transfer to the austenite phase so that the probe will be disconnected from the device. Again when the current is lower, the probe will be connected to the device as the SMA film will transfer back to the martensite phase. In certain industrial fields, such probes can serve as non-destructive fuses, which will be automatically disconnected from the device if the environmental temperature or the current passing through the device is too high.

Figure 13:
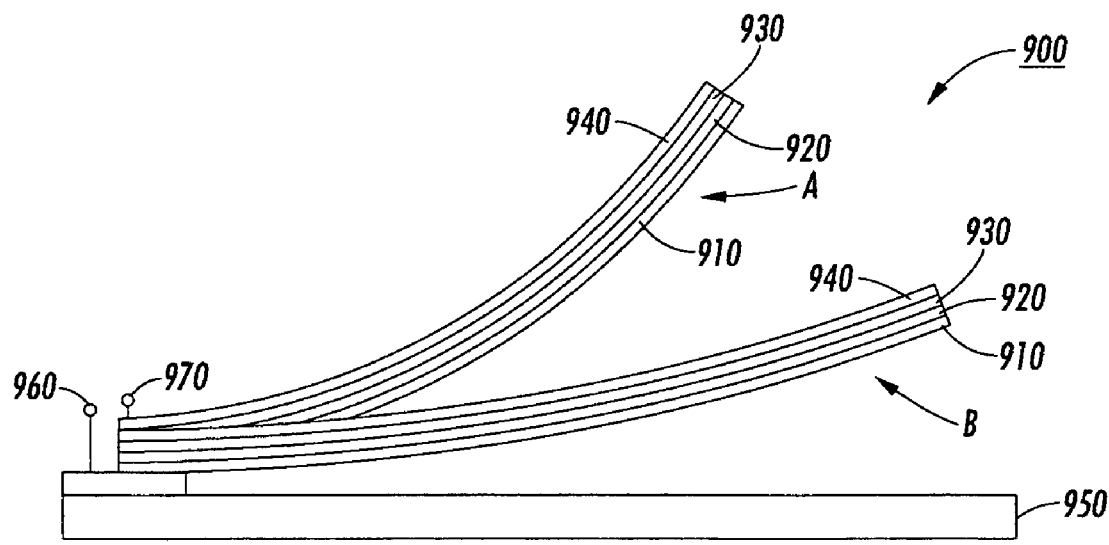
FIG. 13 shows a system in accordance with the exemplary embodiment having a cantilever structure which combines thermal actuation and shape memory/stressed metal actuation.

In another aspect of the exemplary embodiment, thermal actuation is coupled with a multiple-layer MEMS device. The device comprises one or more SMA layers, one or more stressed material layers such as stressed metal layers, and one or more layers of metal or other materials which have a sufficiently different thermal expansion coefficient as compared to those of the SMA and the stressed metal. An example of such a system is shown in FIG. 13. Specifically, system 900 comprises a SMA layer 910, a stressed metal layer 930, a thin, dielectric layer 920 disposed between the layers 910 and 930, and an additional metal layer 940. The assembly of layers 910, 920, 930, and 940 are affixed at one end, to a substrate 950. Wire connections 960 and 970 are provided to provide electrical communication with the layers 910 and 940. The configuration of the distal end of the assembly and specifically, the end region of the dielectric layer 920, is similar as the configuration depicted in FIG. 10B. As compared to the structure of FIGS. 11A and 11B, the additional metal layer 940 is deposited on top of the stressed metal film 930. This additional metal layer has a much larger thermal expansion coefficient than MoCr and TiNi, such as Al. When the device is in a heated state, shown as "B", not only does the shape memory effect of the TiNi film cause the device to bend less, but also the thermal mismatch between the Al and MoCr/TiNi causes the device to bend less. Hence the device becomes more flat at a heated state, and extra displacement will be added to the displacement caused by the shape memory effect of the TiNi film. The cooled state is shown as "A."

In another aspect of the exemplary embodiment, thermal actuation is combined with stressed metal/SMA actuation in a different manner. In view of FIGS. 10A, 10B and 13, it is contemplated to deposit on the SMA layer, a metal film that functions both as a stressed metal and as a metal with a much larger thermal expansion coefficient than the SMA film. Thus, the extra metal layer 940 as shown in FIG. 13 can be omitted in this strategy. That is, the MEMS actuator would have a similar structure as that shown in FIGS. 10A and 10B, but would exhibit a performance similar to that shown in FIG. 13. At a heated or high temperature condition, the device would be in a state with much less shape deformation due to both the phase transition of the SMA film and the thermal mismatch between the stressed metal film and the SMA film.

In all of the various systems and devices illustrated herein, it will be appreciated that the layered assemblies which use multiple layers of stressed material films can use two or more layers of the same type of stressed material, two or more layers of the same type of stressed material however having different characteristics, or two or more layers of different types of stressed materials. Similarly, multiple layers of SMA's can be used. And, one or multiple layers of other types of shape memory materials can also be used.

Additionally, the various devices and layered assemblies described herein can utilize layers of SMA and layers of stressed materials having a wide range of thicknesses. Generally, although the thicknesses of each layer depend upon a variety of factors, representative thicknesses for the SMA layer(s) range from about 0.1 µm to about 500 µm, typically from about 0.5 µm to about 10 µm, more typically from about 0.7 µm to about 4 µm, and in certain instances, from about 0.8 µm to about 2.5 µm. Similarly, representative thicknesses for the stressed material layer(s) range from about 0.1 µm to about 500 µm, typically from about 0.5 µm to about 10 µm, more typically from about 0.7 µm to about 4 µm, and in certain instances, from about 0.8 µm to about 2.5 µm. It will be understood that the exemplary embodiment described herein includes layer thicknesses greater than or less than these thicknesses.

Although the present exemplary embodiment has been described as utilizing a layered combination of an SMA and a stressed material, it is contemplated that the exemplary embodiment includes other arrangements of these materials. For example, the exemplary embodiment encompasses non-layered arrays and combinations of these materials including, but not limited to, encapsulation arrangements such as a sheath-core arrangement, a non-planar layered assembly, and a planar assembly in which one or more of the constituent materials are present in a non-continuous form such as an apertured grid, a mesh, or nearly any other thin form but characterized by having one or more open regions or voids.

Although a wide array of stress magnitudes and stress types can be utilized in the layered assemblies and devices described herein, in certain embodiments, the stress in the stressed material is generally greater than 100 MPa. Similarly, a wide range of stress gradients can be utilized in the assemblies and devices described herein. In certain embodiments, the stress gradient in the stressed material is greater than 100 MPa/µm. As previously noted, these stress values are with respect to the stressed material at its pre-release state.

The exemplary embodiment also provides methods of preparing the multiple-layer MEMS devices, which comprise one or more SMA layers and one or more stressed material layers such as stressed metal layers. In one aspect of the exemplary embodiment, the stressed metal layer is formed by, in a controlled manner, depositing the metal with compressive or tensile stress or a certain stress gradient on the SMA layer. The internal stress or stress gradient of the stressed metal can, when the SMA material is in its martensite phase, effectively cause the multiple-layer MEMS device to bend or otherwise be displaced away or toward the MEMS substrate. Since many SMA films need to be annealed at a temperature within a range of about 400° C. to 700° C. after deposition, and many stressed metal films are usually deposited below 200° C., the method of the exemplary embodiment typically comprises depositing the SMA films first, and then depositing the stressed metal films. However, the exemplary embodiment methods include reversal of this sequence, as under some conditions SMA films can also be deposited below 200° C. The devices can be made on many substrates including, but not limited to, silicon, quartz, glass, and metal. Thus, a stable micro actuation device with very large displacement/force and simple structure can be easily developed.

According to the exemplary embodiment, fabrication of a MEMS device having a cantilever structure can comprise the steps of (a) depositing a sacrificial layer on the substrate; (b) depositing and annealing a SMA film on the sacrificial layer; (c) depositing a stressed material film on the SMA film, in which the deposition parameters are controlled to induce stress or produce a particular stress gradient in the film; and (d) removing the sacrificial layer.

Figure 14:
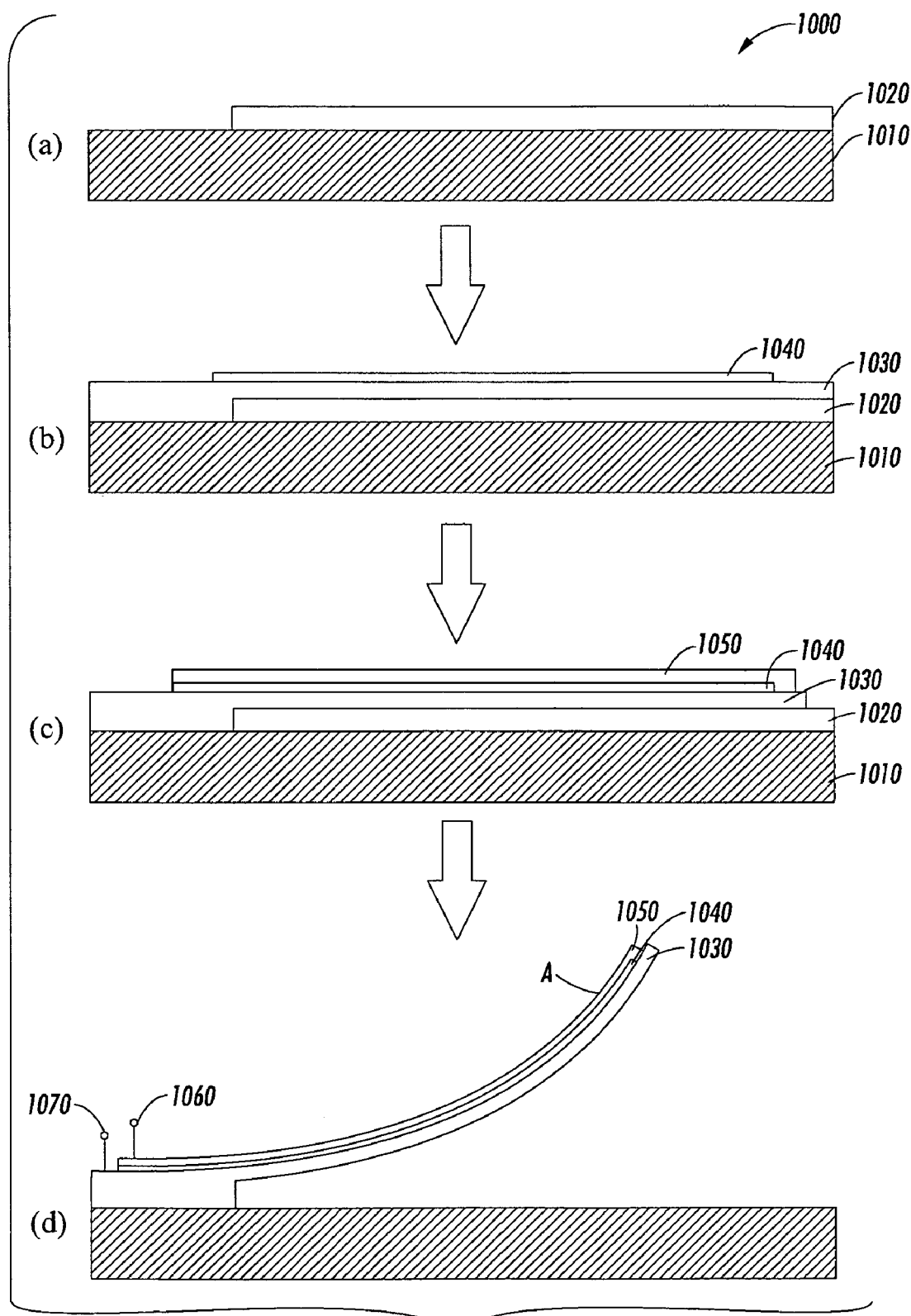
FIG. 14 illustrates various steps in accordance with the exemplary embodiment to produce a stressed metal/SMA cantilever type micro device on a substrate.

In an aspect of the method according to the exemplary embodiment, a process is provided to form cantilever type devices on a silicon substrate. With reference to FIG. 14, an exemplary process 1000 comprises providing a substrate 1010 such as a bare silicon wafer. Next, the process 1000 comprises depositing a sacrificial layer 1020 such as amorphous silicon or PSG (phosphate glass). Then a portion of this sacrificial layer is removed by using a patterning method, such as a dry or wet chemical etching method. This is depicted in step (a) of FIG. 14. Next, the process 1000 comprises depositing for example by evaporation, vapor deposition, or sputtering methods, a SMA film 1030, such as TiNi film, and annealing at 400 to 700° C. for crystallization. A low temperature annealing process with an annealing temperature around or below 200° C. can also be used. The process then includes depositing a dielectric layer 1040 such as oxide or nitride, and patterning the dielectric layer. At this stage of the process, the assembly generally corresponds to that shown in (b) of FIG. 14. Next, the process 1000 comprises depositing a stressed metal film 1050, such as Ni or MoCr, in which the deposition parameters are controlled to induce stress or produce a desired stress gradient in the film, e.g., to have compressive stress at the bottom and tensile stress at the top. Then the stressed metal film 1050 and the SMA film 1030 are patterned to remove a portion of each. The resulting assembly is shown in step (c) of FIG. 14. Next, the process 1000 comprises a step of removing the sacrificial layer 1020 and bonding wire connections 1060 and 1070 for subsequent application of electrical current. After removing the sacrificial or release layer under the metal film, the resulting cantilever structure is released and will bend upward to position A for example, due to the stress gradient in the stressed metal layer from step (c) deposition. This is depicted in step (d) of FIG. 14.

According to the exemplary embodiment, fabrication of a MEMS device having a diaphragm structure can comprise the steps of (a) depositing a SMA film; (b) depositing a stressed material or stressed metal film, and controlling the deposition parameters to induce stress or produce a certain stress gradient in the film; and (c) removing part of the substrate to form a cavity.

Figure 15:
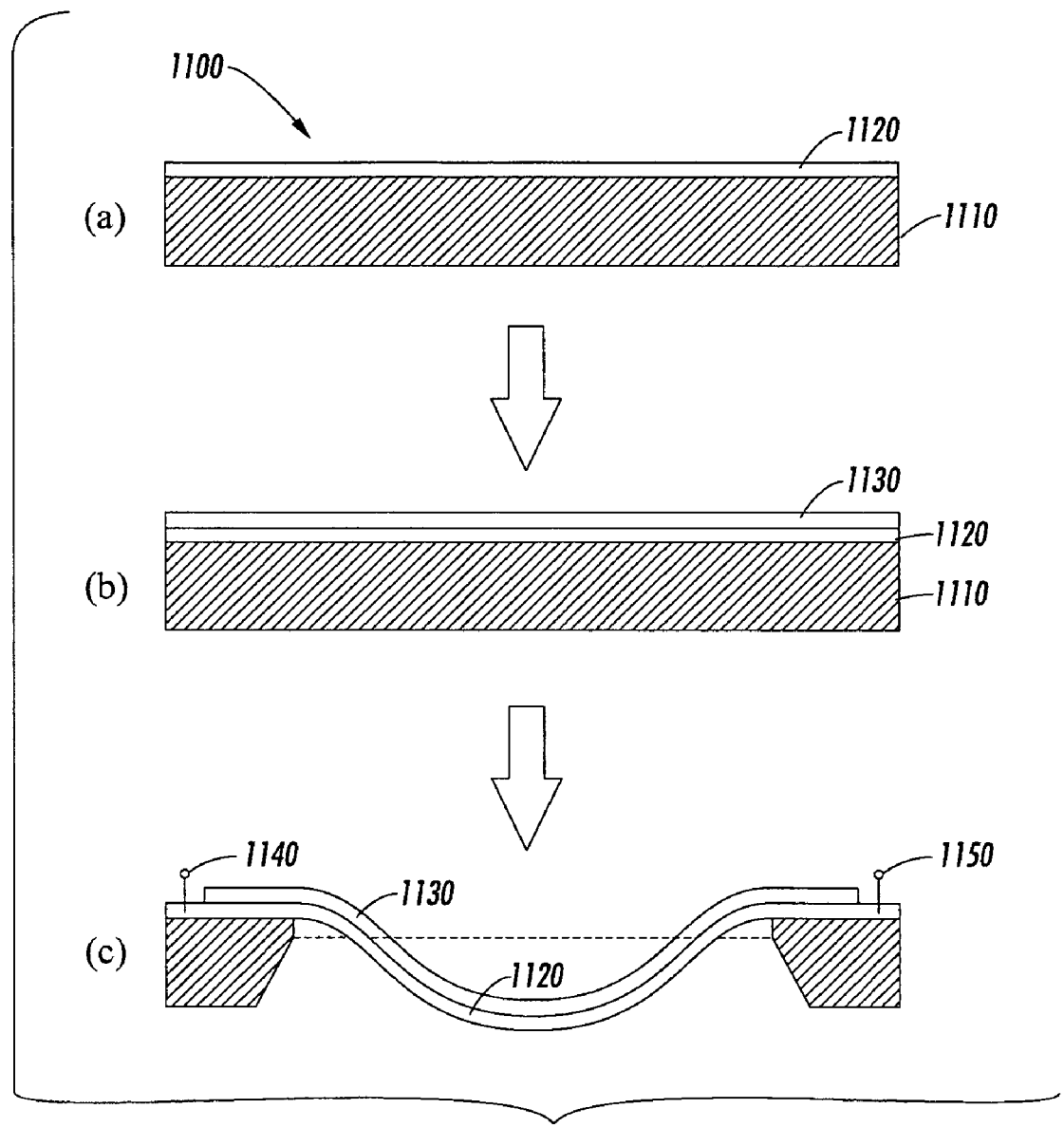
FIG. 15 shows various steps in accordance with the exemplary embodiment to produce a stressed metal/SMA diaphragm type micro device on a substrate.

In a specific aspect of the exemplary embodiment, a method is provided to form diaphragm type devices on a substrate such as silicon. With reference to FIG. 15, an exemplary process 1100 comprises providing a substrate 1110 such as a wafer of bare silicon. The process also includes depositing a SMA film 1120, such as TiNi film, in which the deposition can be performed for example by using evaporation, vapor deposition or sputtering methods, and annealing for crystallization by either using a conventional annealing process with an annealing temperature from about 400° C. to about 700° C. or a low temperature annealing process with an annealing temperature around or below 200° C. The resulting assembly corresponds to that shown in step (a) of FIG. 15. Next, the process 1100 comprises depositing a stressed metal film 1130, such as Ni or MoCr, and controlling the deposition parameters to induce stress or a stress gradient in the films, e.g., to have compressive stress at the bottom and tensile stress at the top. At this stage, the assembly corresponds to that shown in step (b) of FIG. 15. The process 1100 further comprises a step of patterning the stressed metal film 1130 and SMA film 1120, removing a portion of the substrate to form a cavity, and bonding wire connections 1140 and 1150 for applying electrical current. The diaphragm structure will bend or otherwise be displaced downward or upward due to the stress gradient in the stressed metal layer.

Figure 16:
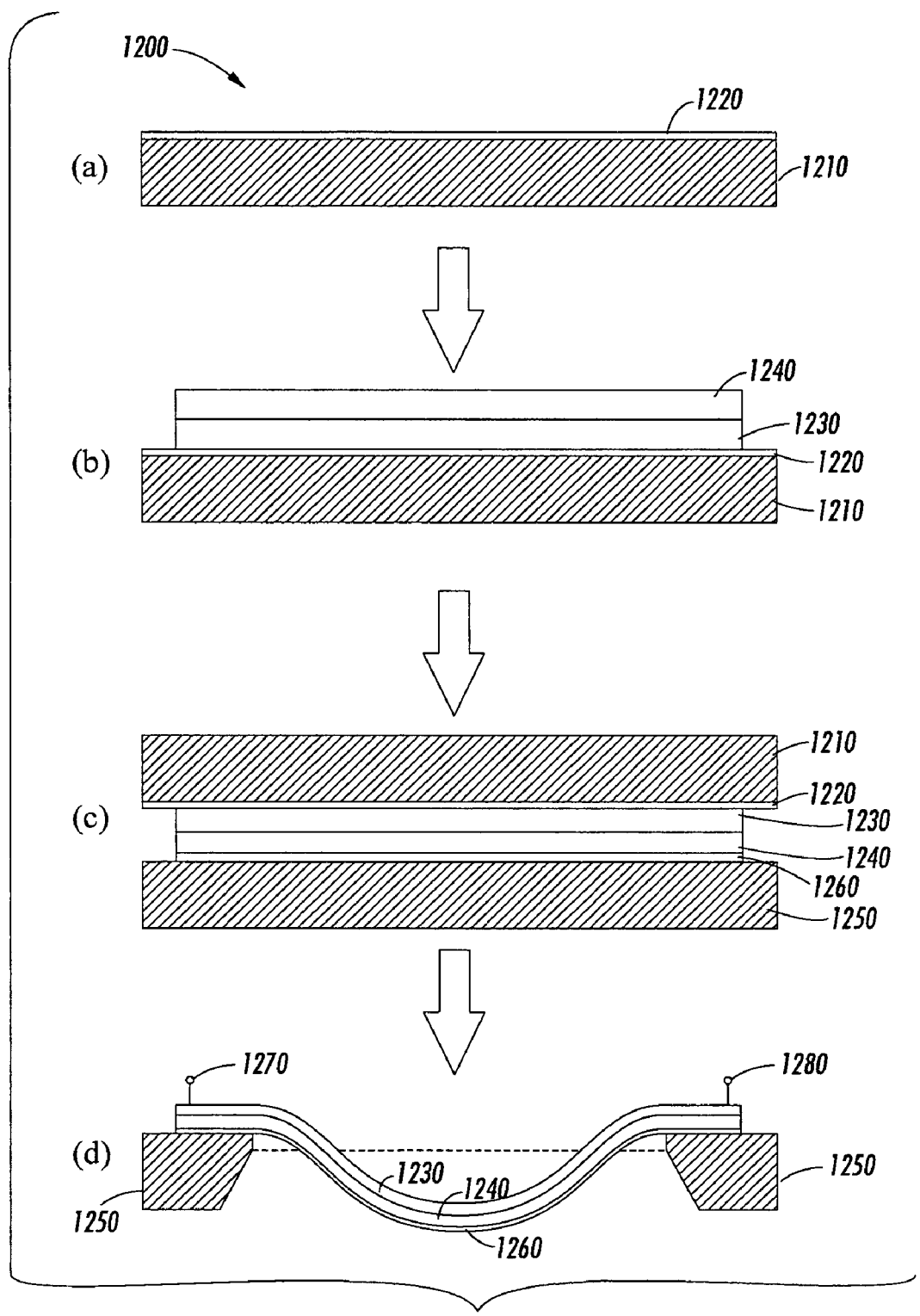
FIG. 16 illustrates various steps in accordance with the exemplary embodiment to produce a stressed metal/SMA diaphragm type micro device using a transfer method.

If the substrate cannot withstand the temperature used to anneal the SMA film, or the order of SMA film and stressed metal film should be reversed, a transfer or lift-off process can be used. With reference to FIG. 16, an exemplary process 1200 provides a transfer method to produce a SMA/stressed metal diaphragm structure. First, exemplary process 1200 comprises providing a substrate 1210 such as a wafer of bare silicon and depositing a sacrificial layer 1220, such as amorphous silicon or PSG on the substrate 1210. The resulting assembly corresponds to that shown in step (a) of FIG. 16. Next, the process includes depositing a SMA film 1230, such as TiNi film, in which the deposition can be done by using evaporation, vapor deposition or sputtering methods, and annealing for crystallization. The process also includes depositing a stressed metal film 1240, such as Ni or MoCr, and controlling the deposition parameters to induce stress or a stress gradient in the films, e.g., to have tensile stress at the bottom and compressive stress at the top. The SMA film and stressed metal film can be patterned to remove a portion of each. At this stage, the assembly corresponds to that shown in step (b) of FIG. 16. Next, the stressed metal film 1240 is bonded or otherwise affixed to a final target substrate 1250, and a bonding layer 1260 is formed or otherwise disposed between the stressed metal film 1240 and the target substrate 1250. Various bonding methods, such as thin film metal eutectic bonding, can be used. The resulting assembly corresponds to that shown in step (c) of FIG. 16. Finally, the sacrificial layer 1220 is etched away and the stressed metal film 1240/SMA film 1230 can be separated from the substrate 1210. Then the final target substrate 1250 is patterned to form a cavity. Electrodes or conductors 1270, 1280 are attached. The SMA/stressed metal diaphragm structure will bend or otherwise be displaced downward or upward due to the stress gradient in the stressed metal layer. Clearly, a cantilever structure can be formed using a similar process. A cantilevered structure could be formed for example, by depositing a second sacrificial layer on the target substrate prior to its affixment to the stressed material film. Upon removal of the second sacrificial layer, the device would be released to its cantilevered form.

It is noted periodically herein that one or more layers can be patterned. It will be appreciated by those skilled in the art, that this refers to optional steps in which refining or finishing aspects are imparted to or performed upon one or more of the layers. These operations are merely optional with regard to the exemplary embodiment methods described herein, and are largely dictated by the particular application of the device or system being fabricated.

Moreover, the layered structures and devices described herein also include the use of selective placement of a relatively small region or layer having a small "footprint" on a larger region or layer. The layer having the smaller footprint can be the stressed material, the SMA, or another functional material; and the layer having the larger footprint can be the stressed material, the SMA, or another functional material. For example, the exemplary embodiment includes a layered array or membrane structure in which only one or more perimeter regions or corners of the array include layers of a stressed material and a SMA.

Advantageously, the exemplary embodiment provides micro devices that can be used as actuators, especially microvalves and micropumps, due to their large deformation ability and high energy density. Without being limited to any particular theory, the actuation is believed to be a result of the change of mechanical properties of the SMA films at different temperatures and effect of a stressed material in close proximity. The devices according to the exemplary embodiment have much larger displacement and actuation force than many other actuators. Also the devices can have very simple mechanical structures, and therefore can be easily fabricated.

Moreover, the devices of the exemplary embodiment with a cantilever structure can be used as a packaging probe with a non-destructive fuse function. These MEMS devices also have great potential in microfluidic, especially biological fluidic areas, because the materials used in forming these devices are compatible with many biological agents. Specifically, examples of such materials include, but are not limited to silicon and TiNi alloy.

The exemplary embodiment constituted as described above will now be described in further detail by way of working examples.

EXAMPLES

For purpose of illustrating the advantages of the stressed metal/SMA micro devices for actuation applications, representative actuator models were established utilizing a cantilever structure and compared to cantilever piezoelectric bimorph and thermal bi-metal actuators. Theoretical calculations were conducted to acquire parameters such as tip displacement and spring constant.

Example 1

Stressed Metal (MoCr)/SMA (TiNi) Film Actuator Model

An actuator was modeled having a length of 500 µm, a thickness of 3.75 µm, and a width of 100 µm. The actuator included a 1.75 µm-thick TiNi layer, a 1 µm thick MoCr layer with −1 GPa deposited compressive stress, and a 1 µm thick MoCr layer with +1 GPa deposited tensile stress. Tip displacement (µm) and spring constant (N/m) of the actuator are calculated and tabulated in Table 1, below.

Example 2

Piezoelectric PZT Bimorph Actuator Model

An actuator also having a length of 500 µm, a thickness of 3.75 µm, and a width of 100 µm was modeled. The structure of the actuator included of two PZT films, each of which was 1.875 µm thick. Tip displacement (µm) and spring constant (N/m) of the actuator are calculated and tabulated in Table 1.

Example 3

Si/Al Thermal Actuator Model

An actuator also having a length of 500 µm, a thickness of 3.75 µm, and a width of 100 µm was modeled. The structure of the actuator included a 1.5 µm thick Si film and 2.25 µm-thick Al film. Tip displacement (µm) and spring constant (N/m) of the actuator are calculated and tabulated in Table 1.

Example 4

Stressed Metal (MoCr)/SMA (TiNi) Film Actuator Model

An actuator having a length of 100 µm, a thickness of 3.75 µm, and a width of 20 µm was modeled. The structure of the actuator included a 1.75 µm thick TiNi, 1 µm thick MoCr layer with −1 GPa deposited compressive stress, and 1 µm-thick MoCr with +1 GPa deposited tensile stress. Tip displacement (µm) and spring constant (N/m) of the actuator are calculated and tabulated in Table 1.

Example 5

Piezoelectric PZT Bimorph Actuator Model

An actuator also having a length of 100 µm, a thickness of 3.75 µm, and a width of 20 µm was modeled. The structure of the actuator included two PZT films, each of which was 1.875 µm thick. Tip displacement (µm) and spring constant (N/m) of the actuator are calculated and tabulated in Table 1.

Example 6

Si/Al Thermal Actuator Model

An actuator also having a length of 100 µm, a thickness of 3.75 µm, and a width of 20 µm was modeled. The structure of the actuator included a 1.5 µm thick Si film and 2.25 µm thick Al film. Tip displacement (µm) and spring constant (N/m) of the actuator are calculated and tabulated in Table 1.

A comparison between the stressed metal/SMA actuators, the piezoelectric bimorph and thermal actuators is summarized in Table 1. Sensitivity on the length of the cantilever was also been studied, and the results are given when the cantilever is 100 µm long.

TABLE 1

Comparison between the Actuators of Examples 1-6

| Actuator | Tip displacement (µm) | Spring constant (N/m) |
| --- | --- | --- |
| Example 1 | 103 | 1.6 |
| Example 2 | 30 | 0.65 |
| Example 3 | 60.3 | 1.1 |
| Example 4 | 6.35 | 40.0 |
| Example 5 | 1.20 | 16.3 |
| Example 6 | 2.42 | 27.0 |

The theoretical calculations are based on an analytical model developed by David Fork (David Fork et al, Proc. SPIE, Vol. 4176, pp. 226-235), herein incorporated by reference. This model computes the bend radius and neutral point of a bent cantilever for an arbitrary number of initially flat layers of specified modulus, thickness, and internal stress.

Example 1 cantilever structure is 500 µm in length and includes three layers: a layer of TiNi SMA film with various thickness values, a layer of MoCr layer which is 1 µm thick and having an initial, deposited stress of −1 GPa (compressive stress), and another layer of MoCr layer which is also 1 µm thick but having an initial, deposited stress of +1 GPa (tensile stress). The mechanical properties of the MoCr layer and TiNi layer are given in Table 2. In the displacement calculation, bending modulus is used. Bending modulus=Y/$(1-v^2)$, wherein Y is the Young's modulus and v is the Poisson's ratio.

TABLE 2

Mechanical properties of the MoCr and TiNi films

| Material | Young's Modulus (GPa) | Yield Strength (MPa) | Poisson's Ratio | Biaxial Modulus (GPa) | Bending Modulus (GPa) |
| --- | --- | --- | --- | --- | --- |
| MoCr | 321.5 | >2000 | 0.295 | 458.26 | 352.15 |
| TiNi, heated | 83 | 690 | 0.33 | 123.88 | 93.14 |
| TiNi, cold | 34 | 70-150 | 0.33 | 50.75 | 38.16 |

Figure 17:
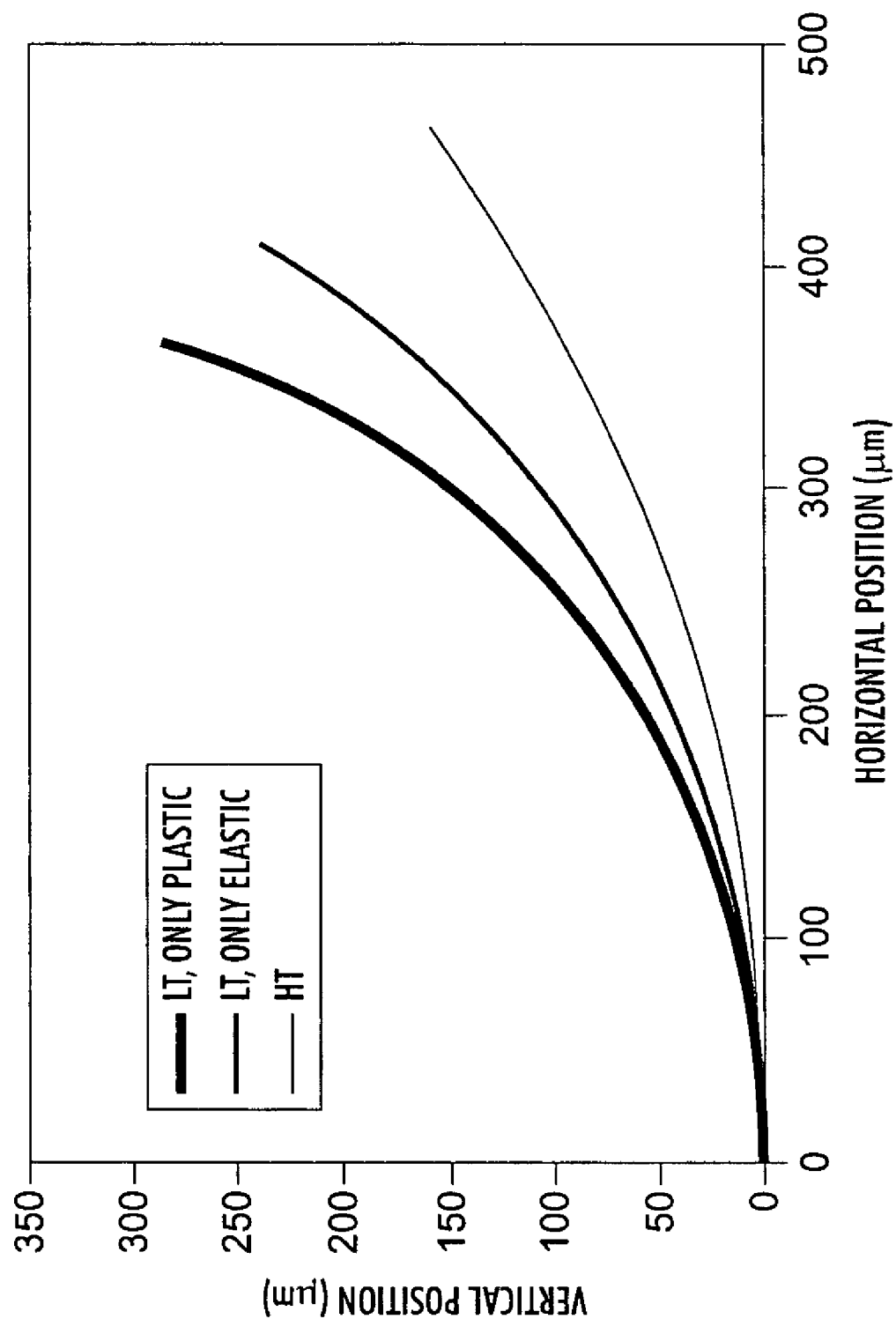
FIG. 17 is a bending curve for a MoCr (stressed metal)/TiNi (SMA) cantilever actuator.

FIG. 17 shows the bending curves for the MoCr (stressed metal)/TiNi (SMA) cantilever actuator with 1.75 μm thick TiNi SMA film. The "LT, only elastic" means that the bending curve is calculated by using the mechanical property data of TiNi at cold or low temperature state and assuming only elastic deformation in the TiNi film. The "LT, only plastic" means that the bending curve is calculated by using the mechanical property data of TiNi at cold or low temperature state and assuming only plastic deformation in the TiNi film (will be explained later). The "HT" means that the bending curve is calculated by using the mechanical property data of TiNi at heated or high temperature state and assuming only elastic deformation in the TiNi film. It can be seen that the bending curves are significantly different between the cold state and heated state, thus can be used as actuators.

By definition, the vertical position difference of the tip point or distal end between the cold state and heated state is the (net) tip displacement of the actuator. The dependence of displacement on the TiNi film thickness is given in FIG. 18.

Figure 18:
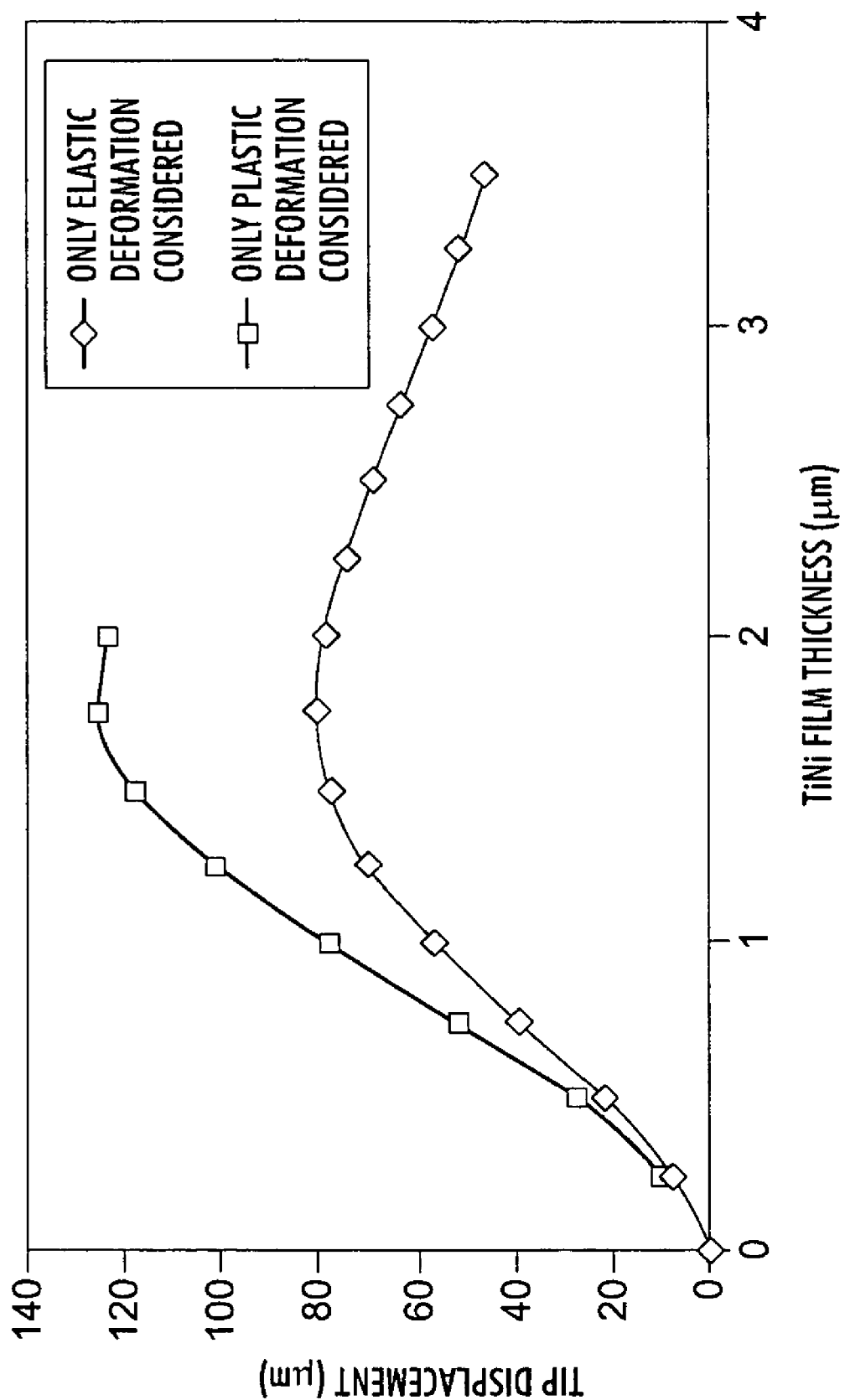
FIG. 18 shows the relationship between tip displacement and TiNi film thickness in a cantilever type system in accordance with the exemplary embodiment.

In FIG. 18, the "only elastic deformation considered" means that when calculating the bending curve at cold state, the assumption is that there is only elastic deformation in the TiNi SMA film. Thus the difference of bending curves between the cold state and heated state, or the tip displacement, is only due to the difference of the Young's modulus between the martensite phase (cold state) and the austenite phase (heated state). However, as the yield strength of the martensite phase is so low, it is possible that the stress induced in the TiNi film can be larger than the yield strength, thus plastic deformation can also be generated, which leads to more deformation in the structure. Therefore, when the bending curves are calculated, the average stress in the TiNi film is also calculated. The results are tabulated in the following Table 3.

than the yield strength when the TiNi layer thickness is between 0.25 to 2.0 μm, thus plastic deformation should be considered.

Calculating the bending curve by combining both elastic deformation and plastic deformation is relatively complicated such that only an extreme condition is considered in this analysis, that is, there is only plastic deformation in the TiNi film. This means that the TiNi film has zero Young's modulus but has a stress of 110 MPa which resists the bending. The bending curve and the displacement under this assumption are calculated, and the results are shown in FIG. 18, corresponding to the curve of "Only plastic deformation considered".

The calculated displacement gives the low limitation when only elastic deformation is considered and gives the high limitation when only plastic deformation is considered. The real displacement will be between these two limitations. By reasonably assuming that the real displacement is the average of low and high limitations, from FIG. 18 it can be observed that the optimized thickness for TiNi film is around 1.75 μm, which produces a tip displacement of about 103 μm.

In the above calculations, the thermal mismatch between the TiNi film and the MoCr film has not been taken into consideration. This is because the difference of thermal expansion coefficients between TiNi and MoCr is very small (6.0 ppm/° C. for TiNi and 5.265 ppm/° C. for MoCr). According to Timoshenko's bi-metal thermal actuator model (described in detail herein), the tip displacement generated by the thermal mismatch is just about 2 μm, which can be neglected.

In addition to the displacement, another important parameter for actuators is the spring constant or stiffness, which describes how large a force can be generated by the actuator. By assuming the materials have isotropic properties and

TABLE 3

Average Stresses in the TiNi SMA Film

| TiNi thickness (μm) | Average axial strain in TiNi at LT | Average axial stress in TiNi at LT (MPa) | Average axial strain in TiNi at HT | Average axial stress in TiNi at HT (MPa) |
|---|---|---|---|---|
| 0.25 | 0.440% | 149.43 | 0.405% | 335.92 |
| 0.50 | 0.451% | 153.30 | 0.379% | 314.53 |
| 0.75 | 0.450% | 152.93 | 0.344% | 285.76 |
| 1.00 | 0.438% | 148.87 | 0.306% | 254.26 |
| 1.25 | 0.418% | 141.98 | 0.269% | 223.32 |
| 1.50 | 0.392% | 133.23 | 0.235% | 194.81 |
| 1.75 | 0.363% | 123.48 | 0.204% | 169.53 |
| 2.00 | 0.334% | 113.43 | 0.178% | 147.60 |
| 2.25 | 0.305% | 103.59 | 0.155% | 128.82 |
| 2.50 | 0.277% | 94.26 | 0.136% | 112.82 |
| 2.75 | 0.252% | 85.61 | 0.120% | 99.22 |
| 3.00 | 0.229% | 77.72 | 0.106% | 87.64 |
| 3.25 | 0.208% | 70.59 | 0.094% | 77.77 |
| 3.50 | 0.189% | 64.19 | 0.084% | 69.32 |

The yield strength of TiNi martensite phase (low temperature or cold state) is 70-150 MPa. The middle value, 110 MPa, is used for further calculation. The yield strength of the TiNi austenite phase (high temperature or heated state) is 690 MPa. From Table 3 it can be seen that the average stress in the austenite phase is always far below the yield strength. This means that in under heated conditions, there is only elastic deformation in the TiNi layer. As such, under a heated condition, the bending curve is always calculated assuming only elastic deformation in the film. On the other hand, under cold conditions the average stress is already greater identical width and length for each layer, and the force is applied on the tip position, the spring constant of a cantilever with multiple layers of different materials can be calculated based on principles of solid state mechanics and mechanics of materials known to those skilled in the art. The spring constant of the exemplary devices and the displacement results are given in Table 1. For these calculations, a device width of 100 μm was utilized.

Comparative calculations on piezoelectric and thermal actuators which are also cantilever structures, can be extended to diaphragm structures.

First, the tip displacement is calculated for a piezoelectric bimorph with a length of 500 μm and a total thickness of 3.75 μm. The device has two layers of piezoelectric PZT thin film with each thickness of 1.875 μm. The tip displacement of a piezoelectric bimorph is given as:

$$\delta = \frac{3L^2}{2t} \cdot d_{31} \cdot E_3$$

In the above equation, L is the length, t is the total thickness, $d_{31}$ is the transverse piezoelectric constant, and $E_3$ is the applied field.

Because the mechanical properties of the two layers in this piezoelectric cantilever are the same, they can be considered as one layer in calculating the spring constant. The spring constant for a single beam can be written as:

$$k = \frac{3YI}{L^3} \text{ and } I = \frac{1}{12} \cdot w \cdot t^3$$

In the above equation, Y is the Young's modulus, I is the moment of inertia, and w is the width of the beam.

Based on these two formulae and the properties of PZT ceramic thin films, the tip displacement and spring constant of a piezoelectric bimorph actuator have also been calculated. The results are listed in Table 4.

TABLE 4

| Tip displacement and spring constant of a piezoelectric bimorph | |
|---|---|
| Beam material | PZT |
| Young's Modulus (GPa) | 62 |
| $d_{31}$ (pm/V) | −100 |
| Applied field (V/μm) | 3 |
| Tip displacement (μm) | 30 |
| Spring constant (N/m) | 0.65 |

For a bi-metal thermal actuator, a cantilever including a layer of silicon and a layer of aluminum is considered. This actuator has a much larger displacement than conventional bi-metal actuators with two metal layers because Si has a much smaller thermal expansion coefficient than metals and Al has a very high thermal expansion coefficient in metals.

The bending curvature of a bi-metal strip is given by Timoshenko, (S. Timoshenko, J. Opt. Soc. Am., Vol. 11, p. 233, 1925), herein incorporated by reference, and can be written as:

$$\frac{1}{R} = \frac{(\alpha_1 - \alpha_2)\Delta T}{\frac{t}{2} + \frac{2(Y_1 I_1 + Y_2 I_2)}{t} \cdot \left(\frac{1}{Y_1 t_1} + \frac{1}{Y_2 t_2}\right)}$$

where R is the radius of the curvature, α is the thermal expansion coefficient, ΔT is the temperature difference, Y is the Young's modulus, I is the moment of inertia, t is the total thickness, and $t_1$ and $t_2$ are each layer thickness.

For the cantilever structure where one end is mechanically fixed, the tip displacement of the other end can be calculated as:

$$\delta = R \cdot \left(1 - \cos\left(\frac{L}{R}\right)\right),$$

where L is length of the cantilever.

Si and Al have Young's moduli of 166 GPa and 70 GPa respectively, and thermal expansion coefficients of 2.8 and 23.1 ppm/° C., respectively. As the TiNi SMA films for MEMS actuators usually have the phase transition temperatures between 60 to 75° C., one can assume that the temperature change for the thermal actuators is from room temperature (20° C.) to 80° C., thus ΔT=60° C. When the cantilever thermal actuator has a length of 500 μm and total thickness of 3.75 μm, using the above two formulae one can calculate the tip displacement of the thermal actuator. The dependence of the tip displacement of a Si/Al thermal actuator on Si layer thickness is given in FIG. 19.

Figure 19:
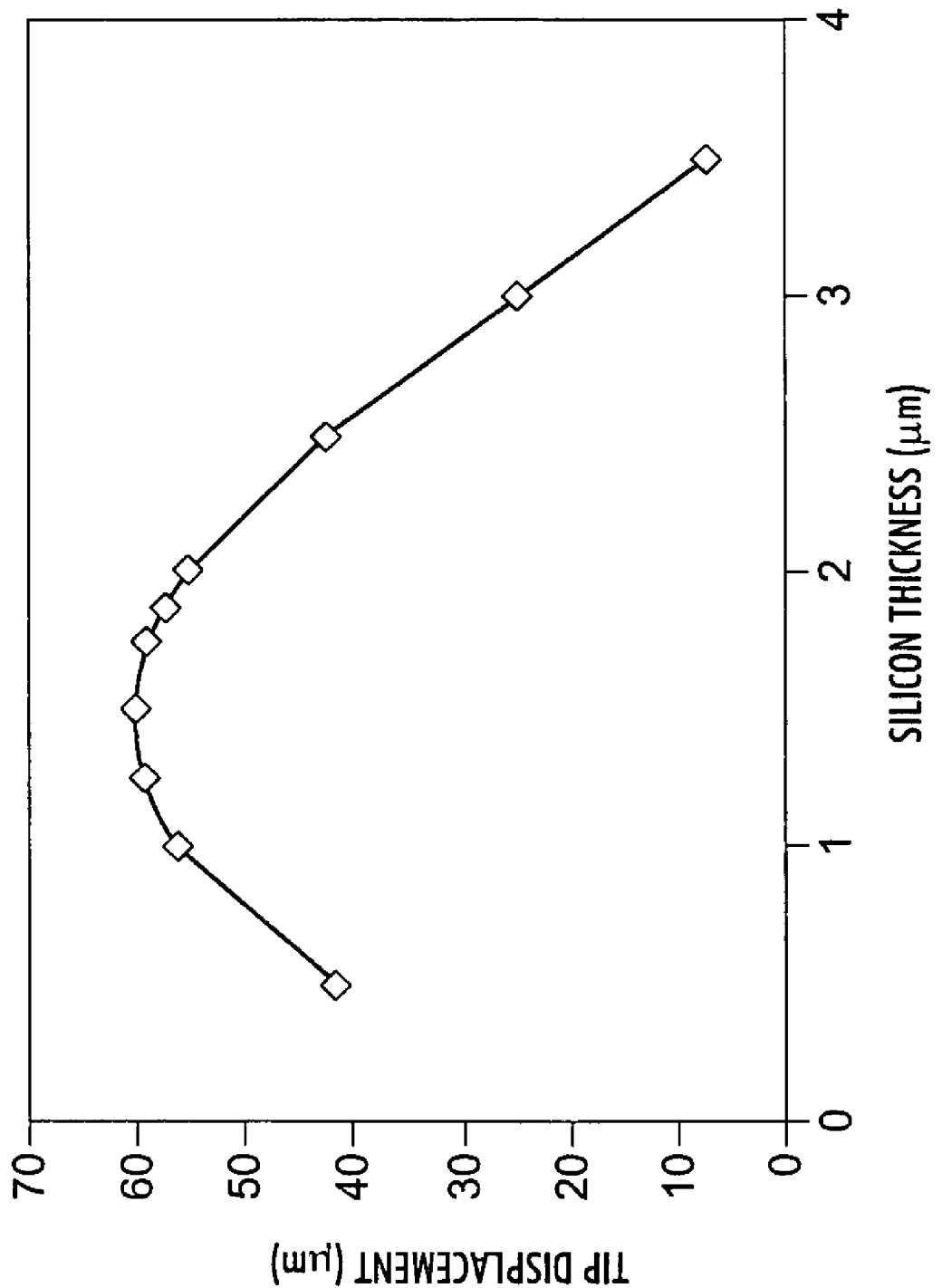
FIG. 19 illustrates the relationship between tip displacement of a Si/Al thermal actuator and Si layer thickness in a system in accordance with the exemplary embodiment.

From FIG. 19, it can be seen that the optimized structure is around the Si layer thickness of 1.5 μm, or Al thickness of 2.25 μm, which gives the tip displacement of 60.3 μm. Assuming the width is 100 μm, the spring constant can be calculated based on principles of solid state mechanics and mechanics of materials known to those skilled in the art, giving a value of 1.1 N/m.

Figure 3A:
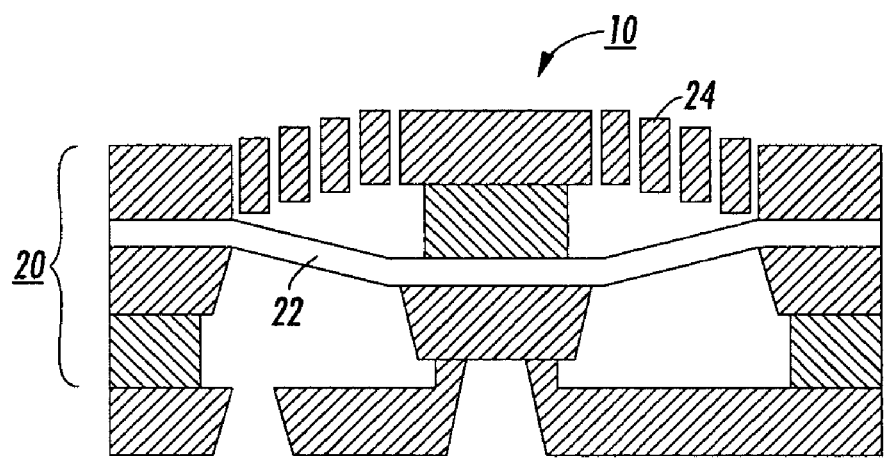
FIGS. 3A and 3B show a SMA thin film microvalve using a silicon spring to provide mechanical stress bias.
Figure 3B:
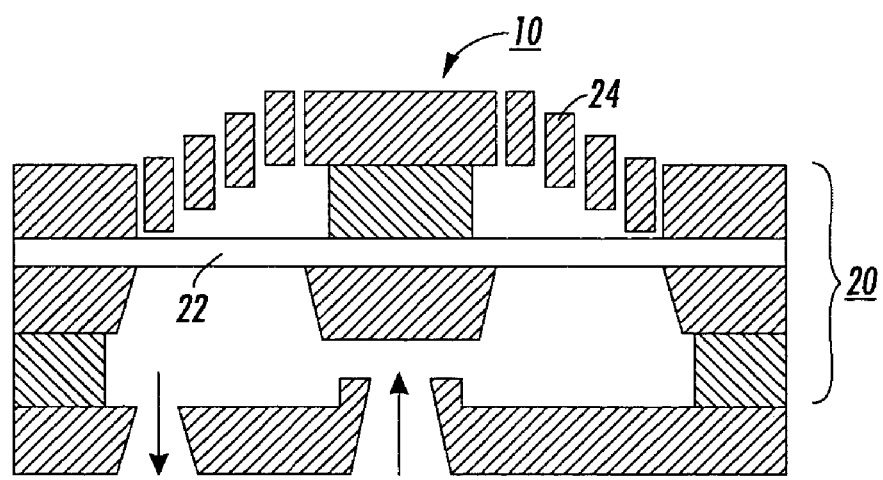
Figure 4:
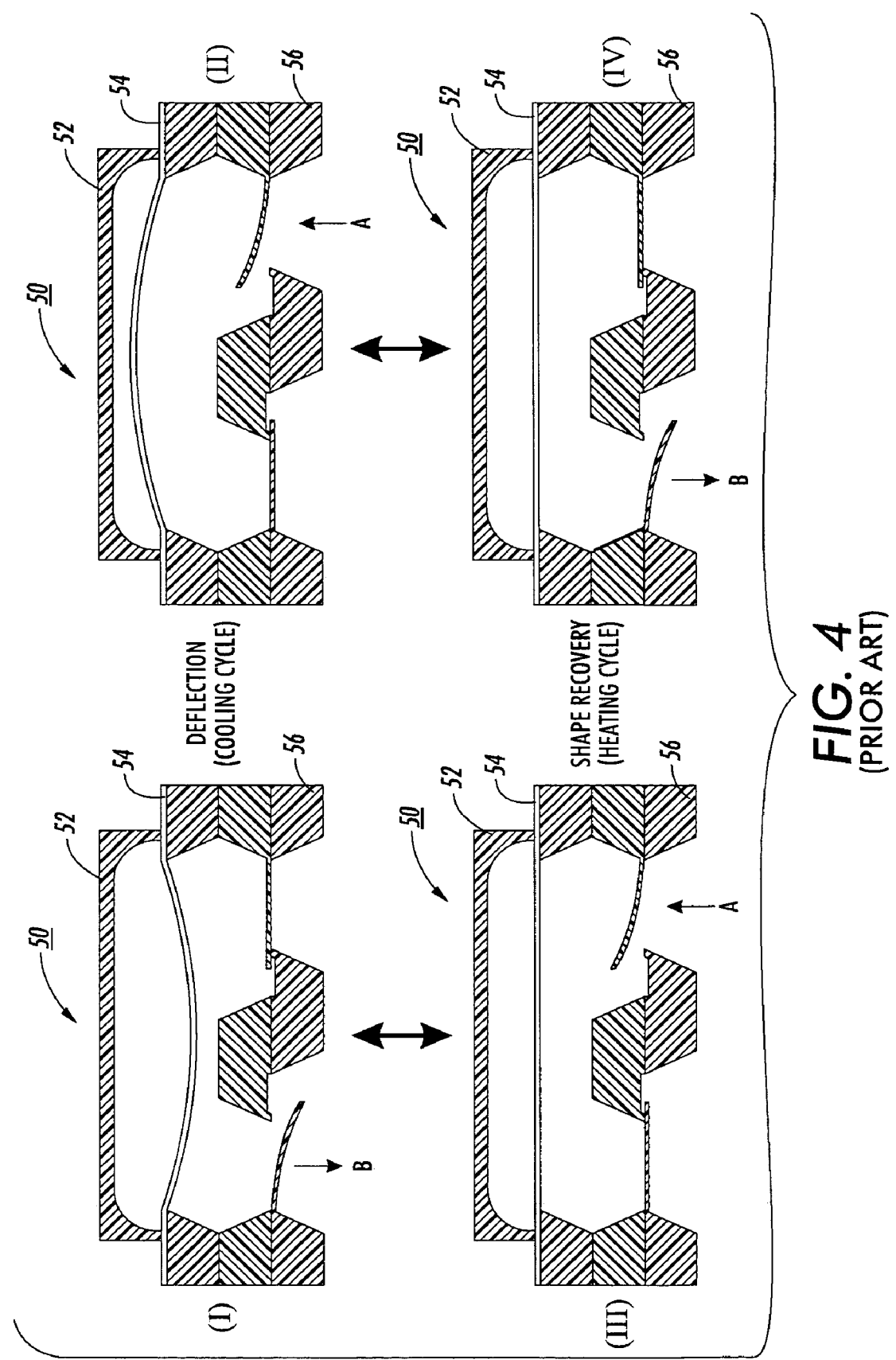
FIG. 4 illustrates the operation of a SMA thin film micropump.

The present exemplary embodiment uses one or several layers of stressed materials, e.g. metal films, as mechanical bias on, or adjacent to, a layer of SMA in a MEMS device. The exemplary embodiment greatly simplifies the SMA actuator structure and still retains the advantages of certain SMA actuators such as large displacement and high force (high mechanical energy). For example, for the microvalve shown in FIGS. 3A and 3B, the complicated silicon spring can be replaced by depositing a stressed metal thin film layer with internal tensile or compressive stress, or by depositing a first stressed metal layer with internal compressive stress and a second stressed metal layer with internal tensile stress in which the first and second films have appropriately selected stresses. The exemplary embodiment can also be applied to the micropump in FIG. 4 to replace the cap.

From Table 1, it can be seen that, with the same total dimensions, the stressed metal/SMA micro actuator provides much larger displacement and force than other actuators. The displacement is 3 to 5 times larger than the piezoelectric bimorphs, and 1.7 to 3 times larger than the thermal actuators. Hence the stressed metal/SMA actuators can be used as bi-stable actuators where large displacement, large force, and/or certain response time (millisecond or less) are required.

Figure 20:
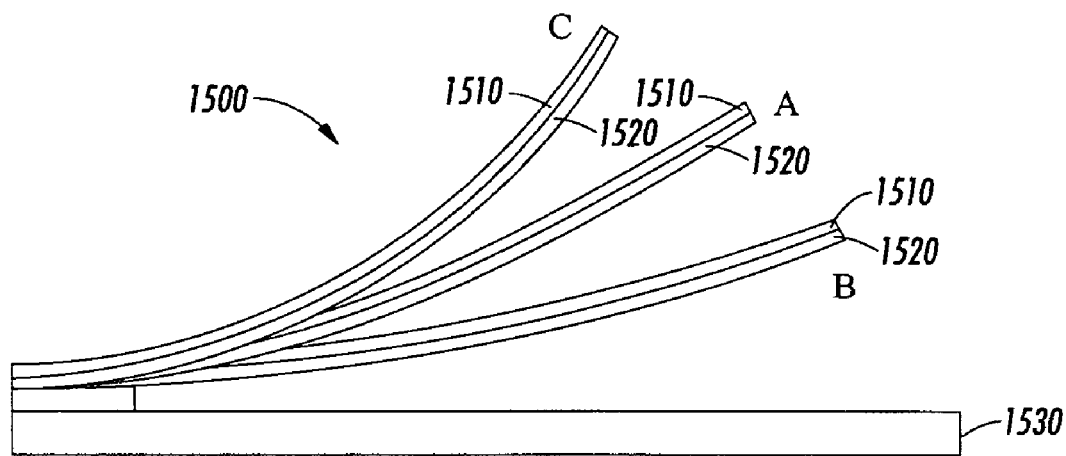
FIG. 20 shows a device in accordance with the exemplary embodiment having a cantilever structure with one layer of a stressed metal film and one layer of a piezoelectric material.

The above examples indicate that for a stressed metal/shape memory alloy bi-layer structure, large displacements can be obtained when a stress or stress gradient in the stress metal layer biases the beam into an initial state of deflection, and the temperature change causes the structure to deform to another state as the temperature variation changes the mechanical properties of the shape memory alloy layer. In addition to using shape memory alloy material and temperature variation, other materials and other mechanisms to change the material properties can be used. In this aspect of the exemplary embodiment, a released assembly of a layer of a stressed material and a layer of another layer which provides a mechanical load to the stressed material is provided. The stressed material includes a stress or stress gradient, such as immediately after its manufacture. The stress or stress gradient is, as previously explained, defined at the pre-release state of the assembly. The inherent stress in the layer of the stressed material causes the assembly to assume a post-release state or position. The physical properties of the other layer can be changed to thereby alter the mechanical load provided by that layer and thereby enable selective positioning of the assembly to a multitude of different positions as compared to the post-release state. For example, FIG. 20 illustrates a device 1500 utilizing a stressed material layer such as stressed metal layer 1510 and a piezoelectric layer 1520, such as lead zirconate titanate, with one end secured to a substrate 1530. The piezoelectric layer 1520 is poled along the thickness direction. The stress or stress gradient in the stressed metal layer 1510 biases the device 1500 into a post-release, initial bending state, State A. When an electric field, with a direction parallel to the polarization direction of the piezoelectric layer 1520, is applied to the piezoelectric layer 1520, it will cause the piezoelectric layer 1520 to expand in the thickness direction and contract in the length direction. Thus the device 1500 will become less bent and change to State B. On the other hand, when an electric field, with a direction anti-parallel to the polarization direction of the piezoelectric layer 1520, is applied to the piezoelectric layer 1520, it will cause the piezoelectric layer 1520 to contract in the thickness direction and expand in the length direction. Thus the device 1500 will become more bent and change to State C. When an AC electric field is applied to the piezoelectric layer 1520, the device 1500 will change between State B and State C.

Piezoelectric layer/sheet metal layer bi-layer structures are known in the prior art and are referred to as unimorph actuators. These structures are flat in their initial state as there is no stress in the sheet metal or silicon layer and the unimorph is moving around the initial flat state when an electric field is applied on the piezoelectric layer. Unlike these bi-layer structures, the stressed metal/piezoelectric actuator has an initial curved structure and it is moving around the initial curved state when an electric field is applied on the piezoelectric layer. Instead of piezoelectric materials or piezoresistive materials, other active materials, such as electrostrictive and magnetostrictive materials, can also be used. The physical properties of these materials can be changed by applying electric or magnetic fields in their presence.

Figure 21:
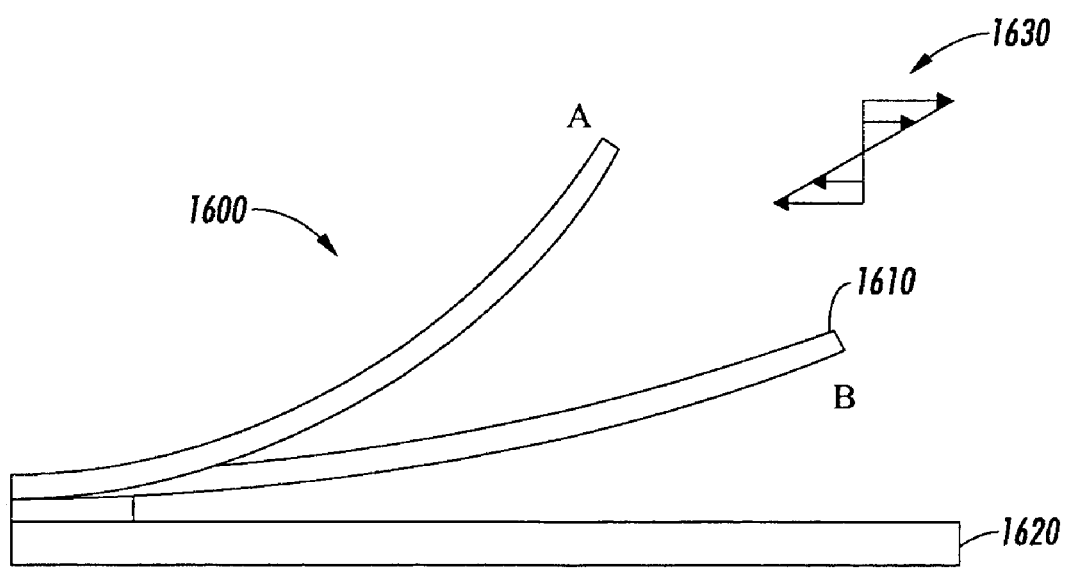
FIG. 21 shows a device in accordance with the exemplary embodiment having a cantilever structure with only one layer of SMA film which has an intrinsic stress gradient.

Moreover, in addition to the stressed metal/shape memory alloy two layer structure, a one layer structure which only utilizes the shape memory alloy material can be used. As shown in FIG. 21, such a device 1600 only utilizes a single shape memory alloy layer 1610 with one end secured to a substrate 1620. A stress gradient exists in the shape memory alloy layer, as indicated by 1630, and this stress gradient will bias the structure into an initial bending state, State A. When changing the temperature and inducing the martensite-austenite phase transition in the shape memory alloy layer 1610, the structure will go to another bending State B. At low temperature the shape memory alloy layer 1610 is in martensite phase and is more ductile, and so the shape memory alloy layer 1610 bends more in State A than State B. Similarly, a device can also comprise two or more layers of shape memory alloy materials with inherent stress or stress gradient in some or all of these layers. For example, a device can have two shape memory alloy layers with one layer having inherent compressive stress and the other layer having inherent tensile stress. The stress or stress gradient will bias the device into an initial bending state. When changing the temperature and inducing the martensite-austenite phase transition in the shape memory alloy layer or layers, the device will go to another bending state. Thus, the device can be used as an actuator.

Furthermore, the exemplary embodiment devices and systems described herein can utilize one or more components or sensors that enable precise control of the extent of bending of the assembly. Specifically, the exemplary embodiment devices and systems can include an integrated sensor and/or an actuator that provides greater control and precision in the bending, deflection, or displacement of the device. For example, an actuation circuit can be incorporated into the exemplary embodiment devices which utilize electrostatic actuation. In addition, a position sensing circuit can be incorporated that provides precise information as to the position or configuration of the device or structure. These and other aspects are described in U.S. Pat. No. 6,734,425, herein incorporated by reference.

It will be understood that although many of the references to the exemplary embodiment refer to a single structure or MEMS device, in practice, a collection or array of structures or devices will be utilized. For example, it is clearly within the scope of the exemplary embodiment to utilize an array of cantilevers, or an array of membranes. In many MEMS applications, artisans use multiple devices or arrays of devices or structures rather than a single device.

The exemplary embodiment can be applied in many industrial fields such as microactuators, micro-switches, microvalves and micropumps for microfluidic devices used in biological/biomedical area, many chemical analysis systems, optical shutters or shuttles, disk drive head actuation (for off-state slap protection), and arrays of cantilevers for printing and imaging. The exemplary embodiment devices can be readily fabricated.

Various exemplary methods and processes are described herein. It will be understood that the sequence or order of steps may be varied or reversed. For example, in many of the processes, either a SMA film can first be deposited and followed by deposition of a stressed material film, or a stressed material film can first be deposited and then be followed by a SMA film.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A device comprising:
   at least one thin film layer of a shape memory material or materials; and
   at least one thin film layer of a stressed and conductive metal material or metal alloy material adjacent to the at least one thin film layer of the shape memory material; the thin film layer of the stressed metal material or metal alloy material possessing an inherent stress or stress gradient imparted to that metal material or metal alloy material layer during its deposition, such that as a result of the inherent stress or stress gradient in the thin film layer or layers of the stressed metal material or metal alloy material, the device is biased to an initial deformation state, wherein the inherent stress is different from an inherent stress in a normally manufactured metal or metal alloy.

2. The device of claim 1 wherein the layer of the shape memory material is immediately adjacent to the layer of the stressed material.

3. The device of claim 1 wherein the layer of stressed material has a uniform composition across its thickness.

4. The device of claim 1, wherein the shape memory material is a shape memory alloy (SMA) selected from the group consisting of NiAl, TiNi, TiNiHf, TiNiCu, TiNiNb, TiNiPd, TiNiCo, TiPdNi, AgCd, AuCd, CuZn, CuZnGa, CuZnSi, CuZnSn, CuZnAl, CuAlNi, CuSn, CuAuZn, InTl, InCd, MnCd, and combinations thereof.

5. The device of claim 1, wherein the shape memory material is selected from the group consisting of polymer materials, ceramic materials, and combinations thereof.

6. The device of claim 1, wherein the stressed metal or alloy material is selected from the group consisting of, molybdenum (Mo), "molybdenum-chrome" alloy (MoCr), tungsten (W), titanium-tungsten alloy (TiW), chromium (Cr), nickel (Ni), nickel-zirconium alloy (NiZr), and combinations thereof.

7. The device of claim 1, wherein the stress in the stressed material is greater than 100 MPa.

8. The device of claim 1, wherein the stress gradient in the stressed material is greater than 200 MPa/μm.

9. The device of claim 1, wherein the device is in the form of a cantilever, with one or both ends clamped or secured to a substrate.

10. The device of claim 1, wherein the shape memory material has a martensite-austenite phase transition temperature of from about −200° C. to about 110° C.

11. The device of claim 1, wherein the device is selected from the group consisting of an actuator, a microswitch, a microvalve, a micropump, and a non-destructive fuse-type connection probe.

12. A reversible and selectively deformable MEMS device comprising:
a released assembly including (i) a single layer of a stressed and conductive metal material or alloy material having a uniform composition across its thickness and having an inherent mechanical stress or stress gradient, the stress being defined at a pre-release state of the assembly, and (ii) at least one other layer proximate to the layer of stressed material, the other layer serving to apply a mechanical load upon the layer of stressed material, wherein the inherent stress is different from an inherent stress in a normally manufactured metal or metal alloy;
wherein the inherent mechanical stress or stress gradient in the layer of stressed material causes the assembly to assume a post-release state, and upon selectively changing the physical properties of the other layer, the assembly is reversibly and selectively deformed to another state different than the post-release state.

13. The device of claim 12, wherein the stress in the stressed material is greater than 100 MPa.

14. The device of claim 12, wherein the stress gradient in the stressed material is greater than 200 MPa/μm.

15. A selectively deformable MEMS curved device comprising:
a single shape memory alloy layer alone, wherein the shape memory alloy itself exhibits an inherent stress gradient in the thickness direction of the film, the stress gradient in the shape memory alloy layer causes the device to assume an initial deformation state, and changing the mechanical properties or stress gradient of the shape memory alloy layer by changing the temperature causes the device to assume another deformation state different than the initial deformation state.

16. The device of claim 15, wherein the stress gradient in the stressed material is greater than 200 MPa/μm.

17. A device comprising:
at least one layer of a shape memory material or materials; and
a single layer of a stressed and conductive metal or alloy material adjacent to the layer or layers of the shape memory material; the layer having a uniform composition across its thickness, and possessing an inherent stress or stress gradient imparted to that layer during its formation, such that as a result of the inherent stress or stress gradient in the layer of the stressed metal or alloy material, the device is biased to an initial deformation state, wherein be inherent stress is different from an inherent stress in a normally manufactured metal or metal alloy.

18. The device of claim 17 wherein the layer of the shape memory material is immediately adjacent to the layer of the stressed material.

19. The device of claim 17, wherein the shape memory material is a shape memory alloy (SMA) selected from the group consisting of NiAl, TiNi, TiNiHf, TiNiCu, TiNiNb, TiNiPd, TiNiCo, TiPdNi, AgCd, AuCd, CuZn, CuZnGa, CuZnSi, CuZnSn, CuZnAl, CuAlNi, CuSn, CuAuZn, InTl, InCd, MnCd, and combinations thereof.

20. The device of claim 17, wherein the stressed material is a metal or alloy selected from the group consisting of, molybdenum (Mo), "molybdenum-chrome" alloy (MoCr), tungsten (W), titanium-tungsten alloy (TiW), chromium (Cr), nickel (Ni), nickel-zirconium alloy (NiZr), and combinations thereof.

21. The device of claim 17, wherein the stress in the stressed material is greater than 100 MPa.

22. The device of claim 17, wherein the stress gradient in the stressed material is greater than 200 MPa/μm.

* * * * *